(12) United States Patent
Wang

(10) Patent No.: US 9,991,270 B2
(45) Date of Patent: Jun. 5, 2018

(54) SEMICONDUCTOR DEVICE AND MANUFACTURING METHOD FOR SAME

(71) Applicant: FUJITSU SEMICONDUCTOR LIMITED, Yokohama-shi, Kanagawa (JP)

(72) Inventor: Wensheng Wang, Kuwana (JP)

(73) Assignee: FUJITSU SEMICONDUCTOR LIMITED, Yokohama (JP)

(*) Notice: Subject to any disclaimer, the term of this patent is extended or adjusted under 35 U.S.C. 154(b) by 0 days. days.

(21) Appl. No.: 15/623,710

(22) Filed: Jun. 15, 2017

(65) Prior Publication Data

US 2017/0287920 A1    Oct. 5, 2017

Related U.S. Application Data

(62) Division of application No. 14/605,383, filed on Jan. 26, 2015, now abandoned.

(30) Foreign Application Priority Data

Feb. 3, 2014    (JP) .................................. 2014-018233

(51) Int. Cl.
*H01L 27/11507*    (2017.01)
*H01L 49/02*    (2006.01)
(Continued)

(52) U.S. Cl.
CPC ...... *H01L 27/11507* (2013.01); *H01L 21/324* (2013.01); *H01L 21/7687* (2013.01);
(Continued)

(58) Field of Classification Search
CPC ............. H01L 27/11507; H01L 21/324; H01L 21/7687; H01L 21/76897; H01L 28/57; H01L 28/65; H01L 28/75
(Continued)

(56) References Cited

U.S. PATENT DOCUMENTS 6,376,325 B1 * 4/2002 Koo ........................ H01L 28/75
257/E21.009
2002/0185683 A1    12/2002 Yamazaki et al.
(Continued)

FOREIGN PATENT DOCUMENTS

EP    1 416 526 A2    5/2004
JP    2000-349252 A    12/2000
(Continued)

OTHER PUBLICATIONS

Extended European Search Report dated Jun. 24, 2015, issued in counterpart European Patent Application No. 15153217.3 (6 pages).
(Continued)

*Primary Examiner* — Cuong Q Nguyen
*Assistant Examiner* — Tong-Ho Kim
(74) *Attorney, Agent, or Firm* — Westerman, Hattori, Daniels & Adrian, LLP

(57) ABSTRACT

A semiconductor device and a manufacturing method for the same are provided in such a manner that the oxygen barrier film and the conductive plug in the base of a capacitor are prevented from being abnormally oxidized. A capacitor is formed by layering a lower electrode, a dielectric film including a ferroelectric substance or a high dielectric substance, and an upper electrode in this order on top of an interlayer insulation film with at least a conductive oxygen barrier film in between, and at least a portion of a side of the conductive oxygen barrier film is covered with an oxygen entering portion or an insulating oxygen barrier film.

6 Claims, 24 Drawing Sheets

(51) Int. Cl.
  *H01L 21/324* (2006.01)
  *H01L 21/768* (2006.01)
(52) U.S. Cl.
  CPC ........ *H01L 21/76897* (2013.01); *H01L 28/57* (2013.01); *H01L 28/65* (2013.01); *H01L 28/75* (2013.01)
(58) Field of Classification Search
  USPC .............................................. 257/532; 438/3
  See application file for complete search history.

(56) References Cited

U.S. PATENT DOCUMENTS

2008/0061345 A1    3/2008  Wang
2008/0142915 A1*   6/2008  Sashida .................. G11C 11/22
                                                         257/421

FOREIGN PATENT DOCUMENTS

JP    2006-319355 A    11/2006
JP    2008-034539 A     2/2008

OTHER PUBLICATIONS

Office Action dated Jun. 27, 2017, issued in counterpart Japanese Application No. 2014-018233, with English translation (5 pages).

* cited by examiner

ABNORMAL PRODUCT

ABNORMAL PRODUCT

PROTECTIVE FILM

IrO$_2$
PZT
Pt
IrO$_x$
Ir
TiAlN
TiN
SiO$_2$

100nm

VIEWED AS THE ABNORMALITY IN THE CONTRAST

ABNORMAL PRODUCT

SEMICONDUCTOR DEVICE AND MANUFACTURING METHOD FOR SAME

CROSS-REFERENCE TO RELATED APPLICATION

This application is a divisional of U.S. application Ser. No. 14/605,383 filed on Jan. 26, 2015, which is based upon and claims the benefit of priority of the prior Japanese Patent Application No. 2014-018233, filed on Feb. 3, 2014, the entire contents of which are incorporated herein by reference.

FIELD

The present invention relates to a semiconductor device and a manufacturing method for the same, and in particular, to a semiconductor device that is formed on a semiconductor substrate so as to be provided with ferroelectric capacitor elements for storing data and memory cell transistors as well as to a manufacturing method for the same.

BACKGROUND

In recent years, the tendency of processing and storing a large volume of data at a high speed has been increasing together with the development of digital technology. Therefore, a ferroelectric memory (FRAM (registered trademark)) using a ferroelectric film with a spontaneous polarization property as the capacitor insulation film has been developed in order to implement a non-volatile RAM where the write-in operation and the read-out operation are possible at a lower voltage and at a faster speed.

As for the FRAM, it is known to be effective to adopt, in place of a conventional planar structure, a stacked structure where a capacitor is formed directly above the contact plug formed on the drain of a transistor that forms a memory cell in order to reduce the cell area.

In an FRAM with a conventional stacked structure, the capacitor is formed directly above a tungsten (W) plug in such a manner that a barrier metal, a lower electrode, a ferroelectric film, and an upper electrode are layered on top of each other in this order, where the role of the barrier metal is to prevent the W plug from being oxidized.

Meanwhile, when the ferroelectric film receives physical damage during film formation for the upper electrode of the capacitor or damage from plasma or an etchant during processing, the crystal structure of the ferroelectric film is partially broken, and thus, the properties of the capacitor elements deteriorate. In order to restore the properties of the capacitor from the thus-deteriorated state, high temperature heat treatment is carried out in an oxygen atmosphere so that the oxygen restores the crystallinity of the ferroelectric film.

Furthermore, an aluminum oxide film that covers a capacitor is formed as a hydrogen permeation preventing film in order to protect the ferroelectric film from being deteriorated by hydrogen after the formation of the capacitor. Subsequently, heat treatment is carried out again in an oxygen atmosphere in order to restore the crystallinity of the ferroelectric film that has been damaged during the patterning of the ferroelectric film and during the formation of the hydrogen permeation preventing film before an interlayer insulation film is formed.

In order to improve the properties of the ferroelectric capacitor, it has been proposed to cover the ferroelectric capacitor with an interlayer insulation film, including a boron nitride (BN) film, of which the film formation is possible in accordance with a plasma CVD method that requires no application of a bias voltage (see Patent Document 1). In this case, no bias voltage is applied, which prevents hydrogen in the film forming atmosphere from entering into the device, and thus, the ferroelectric film can be prevented from deteriorating.

In order to deal with such a problem where an element that forms the ferroelectric film evaporates during a heat treatment process, it has been proposed to cover the ferroelectric capacitor with a double-structure film of reductive element permeation preventing film and an evaporating element compensation film (see Patent Document 2). In this case, the reductive element permeation preventing film prevents hydrogen from entering, and the evaporating element compensation film compensates the element that has evaporated from the ferroelectric film, and thus, the ferroelectric film can be prevented from deteriorating.

PRIOR ART DOCUMENTS

Patent Documents

Patent Document 1: Japanese Unexamined Patent Publication 2006-319355

Patent Document 2: Japanese Unexamined Patent Publication 2008-034539

SUMMARY

According to the prior art, such a problem arises that abnormal products may be generated when high temperature heat treatment is carried out in order to restore the crystallinity of the damaged ferroelectric film after stacked capacitors are collectively etched, which is described in reference to FIGS. 12A to 12C.

FIGS. 12A to 12C are images depicting the situation where abnormal products have been generated in a conventional ferroelectric capacitor. FIG. 12A is an image taken by a scanning electron microscope (SEM) of the surface after collective etching, from which it can be seen that an excellently shaped capacitor has been gained. FIG. 12B is an SEM image of the surface in the case where heat treatment is carried out at 610° C. for 40 minutes in an oxygen atmosphere in order to restore the crystallinity of the damaged ferroelectric film, where abnormal products are generated in bamboo shoot form between capacitors.

FIG. 12C is an image taken by a transmission electron microscope (TM) of a cross-section of the capacitor in the state corresponding to FIG. 12B. The abnormal products, as viewed as the abnormality in the contrast, have been proven to be a substance generated as a result of abnormal oxidation on the sides of the TiAlN film that becomes a conductive oxygen barrier film and the TiN film that becomes a conductive adhesive film beneath the lower electrode.

These abnormal products prevent the protective film, such as an $Al_2O_3$ film, formed on top of it from sufficiently covering and protecting the capacitor, and therefore allows moisture or hydrogen to enter into the ferroelectric film from the interlayer insulation film, and thus, the capacitor loses the ferroelectric characteristics. Furthermore, grinding for flattening after the formation of the interlayer insulation film causes a problem, such as scratching, which therefore greatly affects the yield of the device. Though the methods disclosed in Patent Documents 1 and 2 are effective in protecting the capacitor or flattening the interlayer insulation film, there is a problem such that it is not possible to prevent abnormal products from being generated.

Furthermore, in the case of the stacked structure, such a problem arises that oxygen enters into a W plug through the interface between the conductive oxygen barrier film and the insulation film and oxidizes W in the plug when high temperature heat treatment is carried out in an oxygen atmosphere.

From one disclosed aspect, a semiconductor device is provided with: a semiconductor substrate; an impurity region formed in the semiconductor substrate; an interlayer insulation film formed on top of the semiconductor substrate; a conductive plug formed through the interlayer insulation film and electrically connected to the impurity region; and a capacitor formed of a lower electrode provided on the interlayer insulation film with at least a conductive oxygen barrier film in between, a dielectric film including a ferroelectric substance or a high dielectric substance, and an upper electrode layered on top of each other in this order, and is characterized in that at least a portion of a side of the conductive oxygen barrier film is covered with an oxide film.

From another disclosed aspect, a manufacturing method for a semiconductor device is provided so as to be characterized by including: embedding a conductive plug electrically connected to an impurity region in an interlayer insulation film provided on a semiconductor substrate in which the impurity region is formed; forming at least a conductive oxygen barrier film, a lower electrode, a dielectric film including a ferroelectric substance or a high dielectric substance, and an upper electrode on top of the interlayer insulation film in which the conductive plug is embedded; forming a capacitor with the conductive oxygen barrier film by etching the conductive oxygen barrier film, the lower electrode, the dielectric film including a ferroelectric substance or a high dielectric substance, and the upper electrode; and forming an oxide film in at least a portion of a side of the conductive oxygen barrier film.

According to the disclosed semiconductor device and manufacturing method for the same, it is possible to prevent the conductive oxygen barrier film and the conductive plug in the base of a capacitor from being abnormally oxidized.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
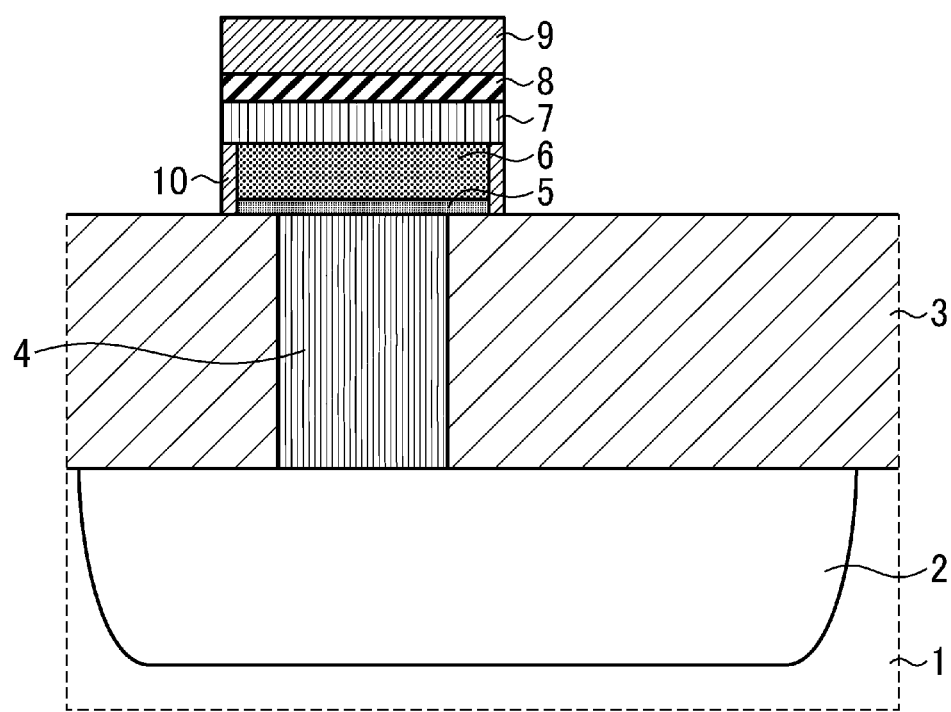
FIG. 1 is a schematic cross-sectional diagram illustrating a main portion of the semiconductor device with a capacitor according to the embodiments of the present invention.

The semiconductor device with a capacitor according the embodiments of the present invention is described below in reference to FIG. 1. FIG. 1 is a schematic cross-sectional diagram illustrating a main portion of the semiconductor device with a capacitor according to the embodiments of the present invention, and illustrates a cross-section in the vicinity of the capacitor. An interlayer insulation film 3 is provided on top of a semiconductor substrate 1 in which an impurity region 2 is provided, and a conductive plug 4 is provided through the interlayer insulation film 3 so as to be electrically connected to the impurity region 2.

A lower electrode 7, a dielectric film 8 made of a ferroelectric substance or a substance with high permittivity, and an upper electrode 9 are layered in this order above the conductive plug 4 with at least a conductive oxygen barrier film 6 in between, and then, collective etching is carried out so as to form a capacitor. At this time, at least a portion of the sides of the conductive oxygen barrier film 6 is covered with an oxide, such as an oxygen entering portion 10 or an insulating oxygen barrier film of which the thickness is greater than that of a natural oxide. Here, the oxygen entering portion 10 may cover the entire surface of the sides of the conductive oxygen barrier film 6, and there may be a case where the oxide has a stoichiometric mixture ratio resulting from complete oxidation or a case where the region is simply rich with oxygen depending on the conditions for oxidation.

At this time, a crystallinity improving conductive adhesive film 4 may further be provided between the conductive oxygen barrier film 6 and the conductive plug 4, and at least a portion of a side of the crystallinity improving conductive adhesive film 4 may also be covered with the oxygen entering portion 10. It is desirable for the thickness of the crystallinity improving conductive adhesive film 5 to be 1 nm to 20 nm because the effects of improving the crystallinity are insufficient when the thickness less than 1 nm, and it is a waste of the film substance when the thickness is 20 nm or more.

The crystallinity improving conductive adhesive film 5 may be made of any conductor selected from among the group consisting of Ti, TiN, Ta, TaN, Pt, Ir, Re, Ru, Pd, Os, Al, and alloys that include any of these metals. In addition, a single layer film of any of the substances selected from the group consisting of TiAlN, TiAlON, TaAlN, TaAlON, HfAlN, HfAlON, IrSiN, IrSiON, IrAlN, IrAlON, RuSiN, RuSiON, Ir, Ru, TiN, TaN, and HfN or a multilayer film of these may be used as the conductive oxygen barrier film 6, which is desired to have conductivity.

In the case where an FRAM is formed, the dielectric film 8 is made of a ferroelectric material, such as: PZT, which is a compound having a Perovskite structure; lead lanthanum zirconate titanate (PLZT); or $SrBi_2(Ta_xNb_{1-x})_2O_9$ (here, 0<x<1) or $Bi_4Ti_2O_{12}$, which are compounds having a bismuth layered-structure. In the case where a DRAM is formed, a material having high permittivity, such as (BaSr)$TiO_3$ (BST) or strontium titanate (STO), may be used. As for the method for film formation, a publicly-known method, such as a sputtering method, a spin-on method, a sol-gel processing method, a metal organic deposition (MOD) method, or an MOCVD method may be used.

A single layer film made of a substance selected from the group consisting of Ir, Ru, Pt, Pd, Os, Rh, $IrO_x$, $RuO_x$, $PtO_x$, $PdO_x$, $OsO_x$, $RhO_x$, and $SrRuO_3$ or a multilayer film made of any of these may be used as the lower electrode film 6. In addition, a single layer of a conductive film that contains any precious metal selected from the group consisting of Ir, Ru, Pt, Os, Rh, and Pd or an oxide of any of these or a multilayer film made of any of these conductive films may be used as the upper electrode film 8.

As for the shape of a cross-section of the capacitor that includes the conductive oxygen barrier film 6, such a structure may be provide that the area of the surface of the conductive oxygen barrier film 6 that faces the lower electrode 7 and includes the oxygen entering portion or the insulating barrier film and the area of the lower electrode 7 that faces the conductive oxygen barrier film 6 are substantially equal. Alternatively, the area of the surface of the conductive oxygen barrier film 6 that faces the lower electrode 7 may be smaller than the area of the surface of the lower electrode 7 that faces the conductive oxygen barrier film 6. In this case, the sides of the conductive oxygen barrier film 6 can be covered with an insulating oxygen barrier film, such as of $TiO_x$, so that oxygen can be prevented from entering into the conductive oxygen barrier film 6 through a side.

In order to form such a capacitor structure, a conductive plug 4 electrically connected to an impurity region 2 is embedded in an interlayer insulation film 3 provided on top of a semiconductor substrate 1 in which the impurity region 2 is formed. After that, at least a conductive oxygen barrier film 6, a lower electrode 7, a dielectric film 8 made of a ferroelectric substance or a substance with high permittivity, and an upper electrode 9 are formed on top of the interlayer insulation film 3 in which the conductive plug 4 is embedded. Then, the conductive oxygen barrier film 6, the lower electrode 7, the dielectric film 8 made of a ferroelectric substance or a substance with high permittivity, and the upper electrode 9 are etched so as to form a capacitor with the conductive oxygen barrier film 6. In addition, an oxygen entering portion 10 or an insulating oxygen barrier film, of which the thickness is greater than that of a natural oxide, may be formed in at least a portion of the sides of the conductive oxygen barrier film 6. Here, a crystallinity improving conductive adhesive film 5 may be formed before the formation of the conductive oxygen barrier film 6 on top of the interlayer insulation film 3 in which the conductive plug 4 is embedded.

In order to form an oxygen entering portion 10, of which the thickness is greater than the thickness of a natural oxide, in at least a portion of the sides of the conductive oxygen barrier film 6, heat treatment may be carried out in an oxygen atmosphere at a stage where the lower electrode 7, the dielectric film 8, and the upper electrode 9 are etched up to the point when the conductive oxygen barrier film 6 is exposed.

Alternatively, the conductive oxygen barrier film 6, the lower electrode 7, the dielectric film 8, and the upper electrode 9 are collectively etched, and then, heat treatment may be carried out in an oxygen atmosphere so that an oxygen entering portion 10 is formed on the entire surface of the sides of the conductive oxygen barrier film 6.

Alternatively, a conductive oxygen barrier film 6 is formed on top of the interlayer insulation film 3 in which the conductive plug 4 is embedded, and then is processed in a predetermined form, and after that, an insulating oxygen barrier film may be formed on the surface from which the processed conductive oxygen barrier film 6 is exposed. In this case, the lower electrode 7, the dielectric film 8, and the upper electrode 9 are formed after the formation of the insulating oxygen barrier film.

According to the embodiments of the present invention, an oxygen entering portion or an insulating oxygen barrier film is formed on the sides of the conductive oxygen barrier film 6 before the capacitor is covered with a hydrogen permeation preventing film, and therefore, abnormal products are not generated in the following high temperature heat treatment process, and thus, the coating properties of the hydrogen permeation preventing film do not deteriorate. As a result, moisture or hydrogen can be prevented from entering into the capacitor, and thus, the dielectric film 8 can be prevented from deteriorating.

In addition, no oxygen enters into the conductive oxygen barrier film 6, and therefore, the oxygen content in the center portion of the conductive oxygen barrier film 6 is lower than the oxygen content on the two sides, and thus, the conductive plug 4 can be prevented from being abnormally oxidized.

First Embodiment

Figure 2A:
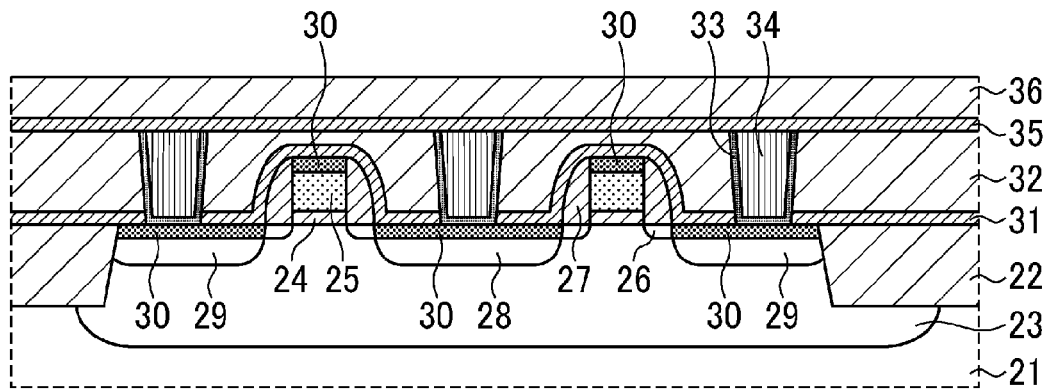
FIGS. 2A and 2B are diagrams for illustrating a step in the middle of the manufacturing process for a ferroelectric memory device according to the first embodiment of the present invention.

Next, the manufacturing process for a ferroelectric memory device according to the first embodiment of the present invention is described in reference to FIGS. 2A to 2M. First, as illustrated in FIG. 2A, an element isolation region 22 with a shallow trench isolation (STI) structure, which defines an active region of the transistors on a silicon substrate 21, is formed. Though an STI structure is adopted here, a local oxidation of silicon (LOCOS) structure may be adopted.

Next, B is introduced into the active region of the silicon substrate 21 so as to form a p type well region 23, which is then followed by thermal oxidation, and thus, a thermal oxidation film that becomes gate insulation films 24 is formed on the surface of the p type well region. Subsequently, an amorphous or polycrystalline silicon film is formed on the entire surface of the silicon substrate 21, and this film is patterned through photolithography so as to form two gate electrodes 25. These two gate electrodes 25 are placed parallel to each other with a gap in between, and thus form parts of word lines.

Next, the gate electrodes 25 are used as a mask so that B ions are implanted so as to form pocket regions (not shown), and then, P ions are implanted so as to form n type extension regions 26. After that, an $SiO_2$ film is deposited on the entire surface, which is then followed by etch back, and thus, side walls 27 are formed on the gate electrodes 25.

Next, the side walls 27 and the gate electrodes 25 are used as a mask so that P ions are implanted, and thus, an n+ type source region 28 and n+ type drain regions 29 are formed. As a result of the process up to this stage, the basic structure of two switching transistors with a MOS type structure is formed.

Next, a Co film is formed on the entire surface in accordance with a sputtering method, which is then followed by heat treatment, and thus, the surfaces exposed from the $n^+$ type source region 28, $n^+$ type drain regions 29, and the gate electrodes 25 react with silicon so as to form Co silicide electrodes 30. After that, the unreacted portions of the Co film are removed through wet etching, which is then followed by heat treatment again, and thus, the resistance of the Co silicide electrodes 30 is lowered.

Next, an SiON film 31 with a thickness of 200 nm that becomes a cover insulation film is formed on the entire surface in accordance with a plasma CVD method, and then, an $SiO_2$ film with a thickness of 1000 nm is deposited in accordance with a plasma CVD method using a tetraethoxysilane (TEOS) gas, an oxygen gas, and a He gas. After that, the $SiO_2$ film is polished and flattened in accordance with a chemical mechanical polishing (CMP) method so as to have a thickness of 700 nm on the flat surface of the silicon substrate 21, and thus, a first interlayer insulation film 32 is provided.

Next, the SiON film 31 and the first interlayer insulation film 32 are patterned through photolithography so as to create contact holes with a diameter of 0.25 μm, which reach the $n^+$ type source region 28 and the $n^+$ type drain regions 29. After that, a Ti film with a thickness of 30 nm and a TiN film with a thickness of 20 nm are layered in this order so as to form an adhesive film (glue film) made of a Ti/TiN film 33, and then, a W film is deposited so that the thickness on the flat surface of the first interlayer insulation film 33 becomes 300 nm with the holes being filled in with the W film. After that, the surface is flattened in accordance with a CMP method, and thus, W plugs 34 are formed.

Next, an SiON film 35 with a thickness of 130 nm that becomes an oxidation preventing film is formed on the entire surface in accordance with a plasma CVD method, and after that, an $SiO_2$ film with a thickness of 300 nm is deposited in accordance with a plasma CVD method using a TEOS gas, an oxygen gas, and a He gas again, and thus, a second interlayer insulation film 36 is provided. Though an SiON film is used as the oxidation preventing film here, an SiN film or an $Al_2O_3$ film may be used.

Figure 2B:
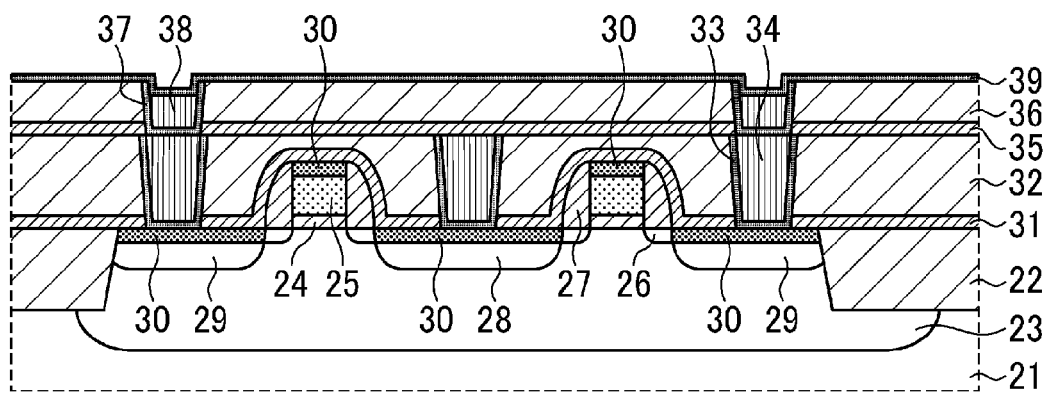

Next, as illustrated in FIG. 2B, the SiON film 35 and the second interlayer insulation film 36 are patterned through photolithography so that contact holes that reach the W plugs 34 on the two sides are created. After that, a Ti film with a thickness of 30 nm and a TiN film with a thickness of 20 nm are layered in this order, and then, the contact holes are filled in with a W film with a Ti/TiN film 37 in between, which is then followed by flattening in accordance with a CMP method, and thus, W plugs 38 are formed. In this CMP process, SSW2000 (product model made by Cabot Microelectronics Corporation) is used as a slurry, which makes the polish rate of the Ti/TiN film 37 and the W film to be polished faster than the polish rate of the second interlayer insulation film 36, which is the base. In addition, the amount polished in this CMP process is set greater than the total thickness of the respective films in order to prevent any residue from remaining on the second interlayer insulation film 36 after polishing, and therefore, the W film is over-polished and recesses are created in the W plugs 38.

Next, a Ti film with a thickness of 5 nm that becomes a crystallinity improving conductive adhesive film is formed on the entire surface in accordance with a sputtering method in an atmosphere with 50 sccm of Ar under a pressure of 0.11 Pa where the temperature of the substrate is 150° C. and the power is 0.5 kW or less. After that, heat treatment is carried out for 60 seconds at 650° C. in an $N_2$ atmosphere in accordance with a rapid thermal anneal (RTA) method so that the Ti film is converted to a TiN film 39 with a (111) orientation.

It is desirable for this crystallinity improving conductive adhesive film to be a thin film in order to increase the adhesiveness. In general, it is desirable for the thickness to be 20 nm or less, and more preferably, it is desirable for the thickness to be 5 nm to 10 nm. Though a Ti film with a (111) surface orientation and a body-centered cubic (BCC) structure is used here, any film that includes the crystallinity of the oxygen barrier film formed on top of the film may be used. Ir, Pt, Pd, and Rh films can be cited as desirable examples of films made of a metal with a (111) surface orientation, and particularly with a face-centered cubic (FCC) structure of which the lattice constant is 0.3 nm to 0.5 nm, and more preferably, 0.38 nm to 0.41 nm. Alternatively, a Ta film with a BCC structure or Os, Ru, and Ti metal films with a hexagonal closest packing (HCP) structure are desirable. When these films are formed in accordance with a sputtering method, the films are oriented so as to have a (111) surface. Though the temperature at which a film is formed differs depending on the material of the film, each film is formed at a temperature where the stress applied to the film is low and the crystal is easily oriented.

Figure 2C:
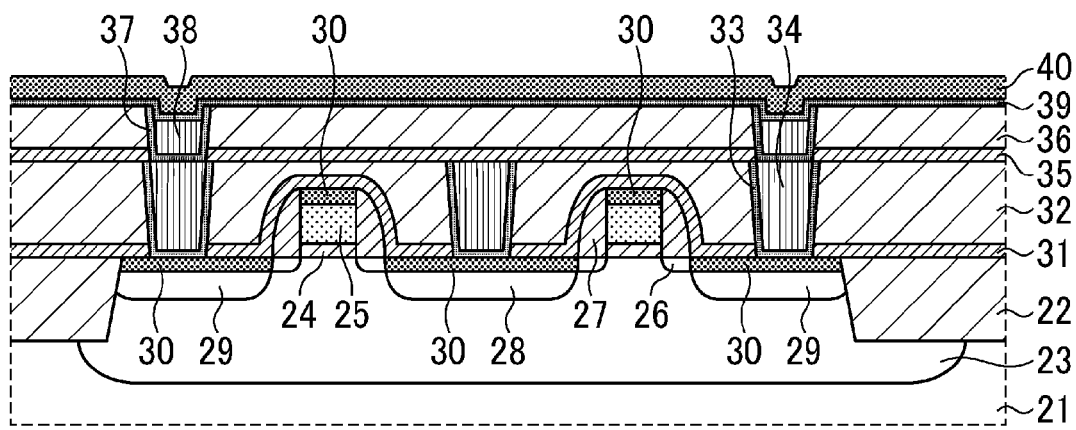
FIGS. 2C and 2D are diagrams for illustrating a step after the step in FIG. 2B of the manufacturing process for a ferroelectric memory device according to the first embodiment of the present invention.

Next, as illustrated in FIG. 2C, a TiAlN film 40 with a thickness of 40 nm that becomes an oxygen barrier film is formed on the TiN film 39. In this case, the conditions for forming a film are such that reactive sputtering using a target of a Ti—Al alloy with a composition of $Ti_{0.6}Al_{0.4}$ is carried out in a mixed gas atmosphere including 30 sccm of Ar and 30 sccm of $N_2$ under a pressure of 253.3 Pa where the temperature of the substrate is 400° C. and the power for sputtering is 3.0 kW. At this stage, there are still recesses in the TiAlN film 40 above the W plugs 38 due to the recesses on the surface of the base. Though TiAlN is used as an oxygen barrier film here, any conductive film that can be ground in accordance with a CMP method may be used. For example, single films made of any of TiAlON, TaAlN, TaAlON, HfAlN, HfAlON, IrSiN, IrSiON, IrAlN, IrAlON, RuSiN, RuSiON, Ir, Ru, TiN, TaN, and HfN or multilayer films made of any of these may be used.

Figure 2D:
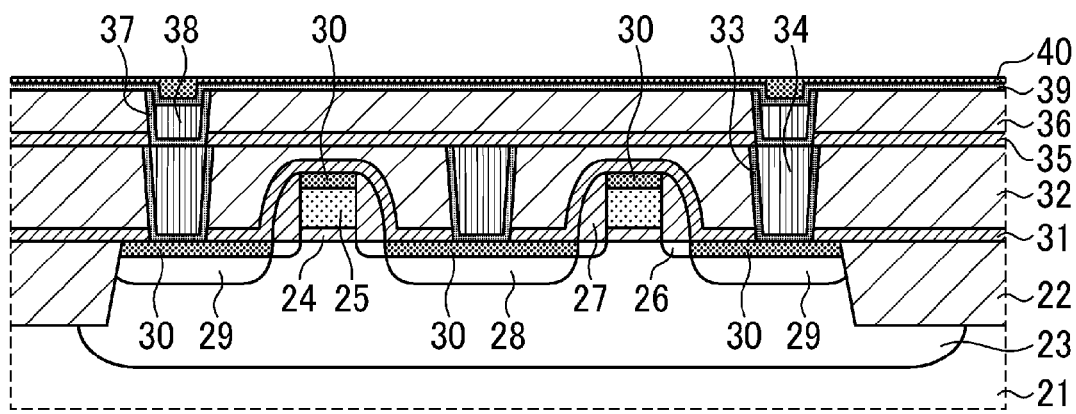

Next, as illustrated in FIG. 2D, the surface of the TiAlN film 40 is polished and flattened in accordance with a CMP method so that the remaining thickness becomes approximately 20 nm. In this CMP process, SS-25E (product model made by Cabot Microelectronics Corporation) is used as a slurry.

Figure 2E:
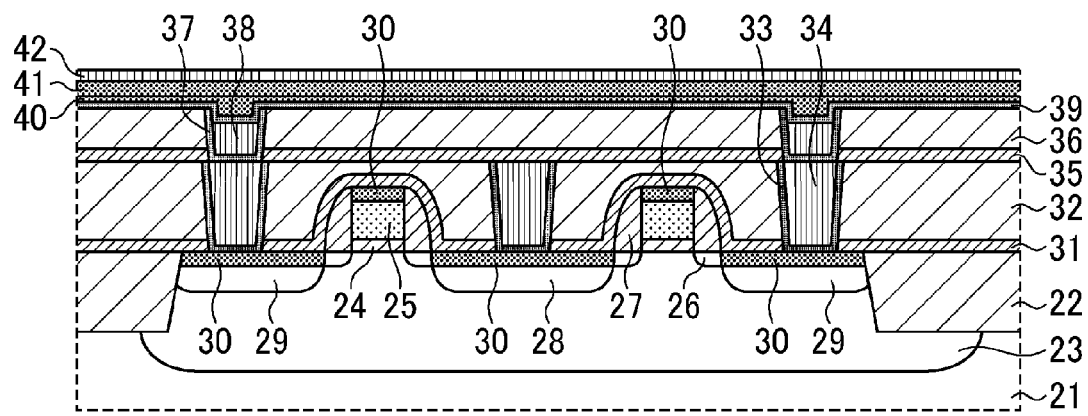
FIGS. 2E and 2F are diagrams for illustrating a step after the step in FIG. 2D of the manufacturing process for a ferroelectric memory device according to the first embodiment of the present invention.

Next, as illustrated in FIG. 2E, a TiAlN film 41, of which the thickness is 25 nm, is formed on the flattened TiAlN film 40. In this case, the conditions for forming a film are such that reactive sputtering using a target made of a Ti—Al alloy with a composition of $Ti_{0.6}Al_{0.4}$ is carried out in a mixed gas atmosphere including 30 sccm of Ar and 30 sccm of $N_2$ under a pressure of 253.3 Pa where the temperature of the substrate is 400° C. and the power for sputtering is 1.0 kW. In this TiAlN film 41, the crystallinity of the TiAlN film 40 is successively oriented so as to have a (111) surface, and thus, the TiAlN film 41 and the TiAlN film 40 become a conductive oxygen barrier film.

Next, an Ir electrode 42 with a thickness of 40 nm is formed in accordance with a sputtering method using an Ir target. At this time, the conditions for forming a film are such that sputtering is carried out in an Ar atmosphere under a pressure of 0.11 Pa where the temperature of the substrate is 450° C. and the power for sputtering is 0.3 kW. Though the thickness of the Ir lower electrode 42 is 40 nm here, the thickness may be 30 nm to 50 nm.

Next, heat treatment is carried out in accordance with an RTA method in an Ar atmosphere at 650° C. or higher for 60 seconds. As a result of this heat treatment, the adhesion between the Ir lower electrode 42 and the TaAlN film 41 as well as the adhesion between the TiAlN film 40 and the TiN film 39 increase, and at substantially the same time, the crystallinity of the Ir lower electrode 42 improves. Though Ir is used for the lower electrode here, precious metal films, such as Pt, Pd, Os, and Rh films, and conductive oxide films, such as $PtO_x$, $IrO_x$, $SrRuO_3$, $RuO_x$, $PdO_x$, $OsO_x$, and $RhO_x$ films can be used. Furthermore, a multilayer structure, such as $Pt/IrO_x/Ir$, $Pt/IrO_x/IrO_y/Ir$, $Pt/SrRuO_3/IrO_x/Ir$, $Pt/PtO_x/IrO_x/Ir$, or $Pt/IrO_x/RuO_x/Ir$, may be used. Though Ar is used for the atmosphere for heat treatment, $N_2$ or $N_2O$ may be used.

Figure 2F:
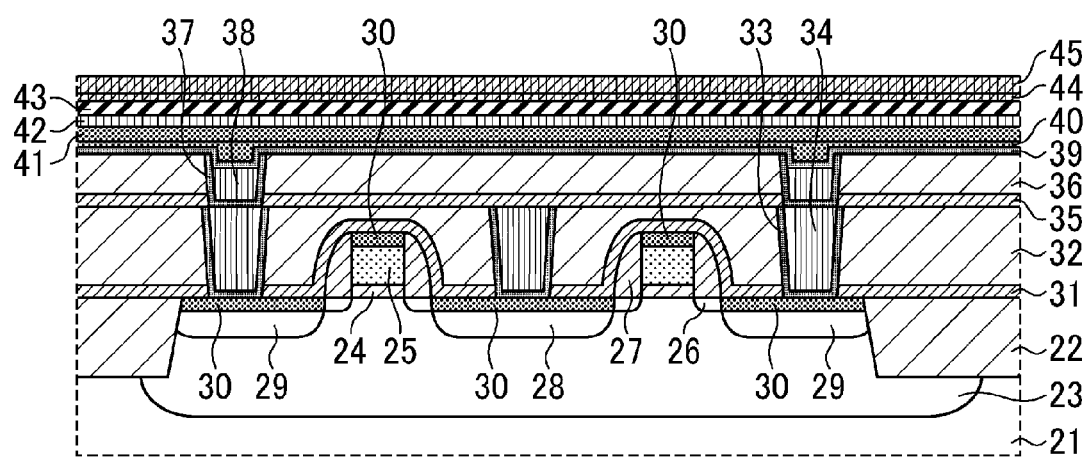

Next, as illustrated in FIG. 2F, a PZT film 43 with a thickness of 80 nm is formed on the Ir lower electrode 42 in accordance with an MOCVD method. In this case, the conditions for forming a film are such that $Pb(DPM)_2$, $Zr(dmhd)_4$, and $Ti(O\text{-}iOr)_2(DPM)_2$ are dissolved in a tetrahydrofuran (THF) solvent so that each has a concentration of 0.3 mol/l, and thus, the respective liquid materials of Pb, Zr, and Ti are gained. After that, these liquid materials are supplied to a carburetor in an MOCVD unit together with a THF solvent, of which the flow rate is 0.474 ml/min, at a flow amount of 0.326 ml/min, 0.200 ml/min, and 0.200 ml/min, respectively, so as to be evaporated, and thus, material gases of Pb, Zr, and Ti are gained. Then, the substrate is held in the reaction chamber of the MOCVD unit at a temperature of 620° C. under a pressure of 665 Pa (5 Torr), and the respective material gases that have evaporated are introduced and a film is formed for 620 seconds.

Next, an $IrO_x$ first upper electrode 44 that has been crystallized at the point in time when the thickness of the film on the PZT film 43 becomes 25 nm is formed in accordance with a sputtering method. The conditions for forming a film at this time are such that a film is formed at 300° C., Ar and oxygen are used as gases for film formation and the flow rates of these are both 100 sccm, and the power for sputtering is approximately 1 kW to 2 kW. After that, heat treatment is carried out in accordance with an RTA method at 725° C. for 120 seconds in a mixed atmosphere including oxygen of 20 sccm and Ar of 2000 sccm. As a result of this heat treatment, the PZT film 43 can be completely crystallized, and at substantially the same time, the $IrO_x$ first upper electrode 44 can be restored from plasma damage during the film formation process and oxygen defects in the PZT film can be compensated.

Next, an $IrO_y$ second upper electrode 45 with a thickness of 200 nm is formed on the $IrO_x$ first upper electrode 44 in accordance with a sputtering method. The conditions for forming a film at this time are such that a film is deposited for 79 seconds in an Ar atmosphere under a pressure of 0.8 Pa where the power for sputtering is 1.0 kW. Though the thickness of the $IrO_y$ second upper electrode 45 is 200 nm, the thickness may be 100 nm to 300 nm. In this case, it is desirable for the $IrO_y$ second upper electrode 45 to have a composition that is close to the stoichiometric composition of $IrO_2$ so as to not catalyze hydrogen in order to suppress deterioration during the process. As a result, such a problem that the PZT film 43 is reduced by hydrogen radicals can be prevented, and the tolerance of the capacitor to hydrogen increases.

Here, Ir, Ru, Rh, Re, Os, Pd, or oxides of these as well as a conductive oxide, such as $SrRuO_3$, and multilayers of these may be used as the material of the upper electrode layer in place of $IrO_x$ or $IrO_y$. Furthermore, an Ir film (not shown) with a thickness of 50 nm is deposited on this structure through sputtering in an Ar atmosphere under a pressure of 1 Pa where the power for sputtering is 1.0 kW as a hydrogen barrier film and a conductivity increasing film. In addition, it is also possible to use a Ru film or an $SrRuO_3$ film as the hydrogen barrier film.

Figure 2G:
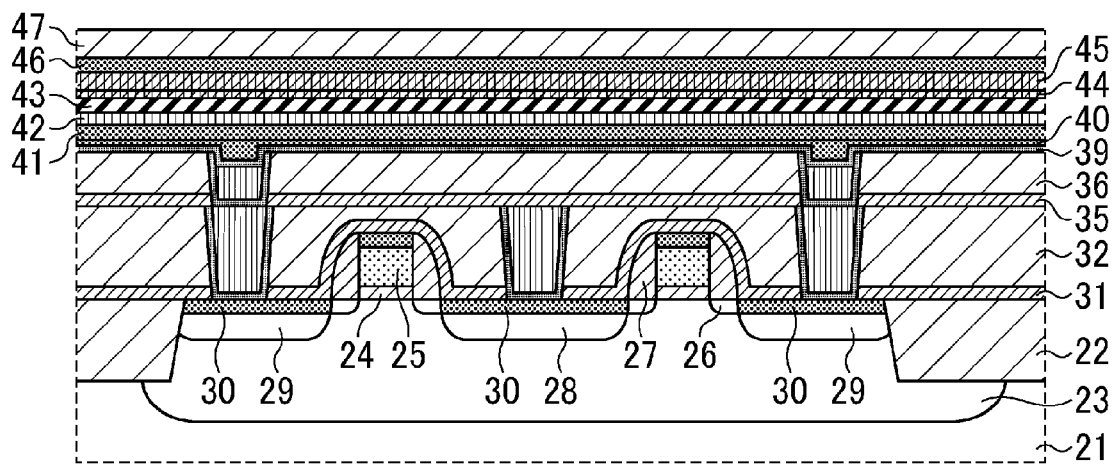
FIGS. 2G and 2H are diagrams for illustrating a step after the step in FIG. 2F of the manufacturing process for a ferroelectric memory device according to the first embodiment of the present invention.

Next, as illustrated in FIG. 2G, the rear surface is washed, and after that, a TiAlN film 46 with a thickness of 200 nm and an $SiO_2$ film 47 with a thickness of 300 nm that become a hard mask for etching are deposited. As described above, the TiAlN film 46 is formed in accordance with a sputtering method, and the $SiO_2$ film 47 is formed in accordance with a plasma CVD method using a TEOS gas as a material. Though the lower layer hard mask is formed of TiAlN here, TiN may be used.

Figure 2H:
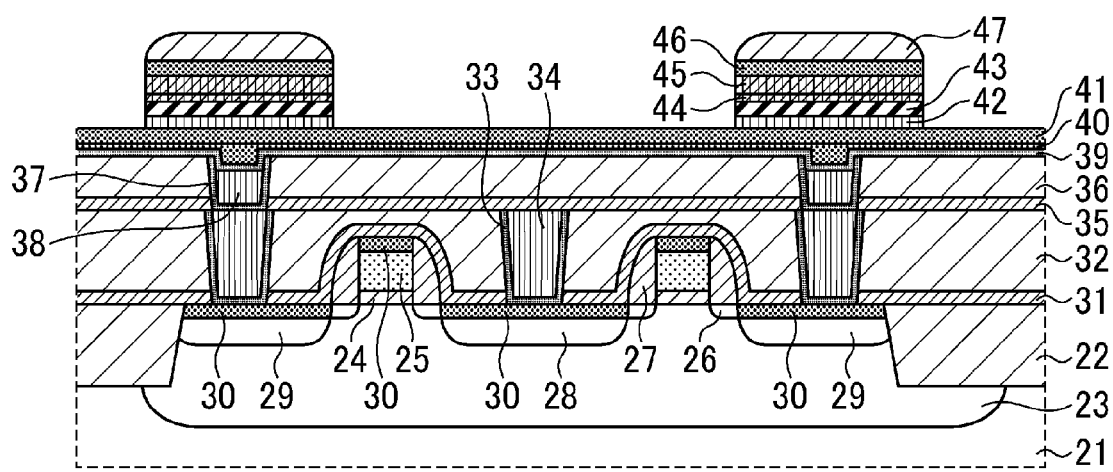

Next, as illustrated in FIG. 2H, the $SiO_2$ film 47 is patterned in island form, and after that, this $SiO_2$ film 47 is used as a mask to etch the TiAlN film 46, and thus, a hard mask with a double-layer structure in island form is formed.

Next, the hard mask is used as a mask for plasma etching where a mixed gas of HBr, oxygen, Ar, and $C_4F_8$ is used as the etching gas so that the $IrO_y$ second upper electrode 45 and the Ir lower electrode 42 as well as the layers between are collectively etched, and thus, a ferroelectric capacitor is formed.

Figure 2I:
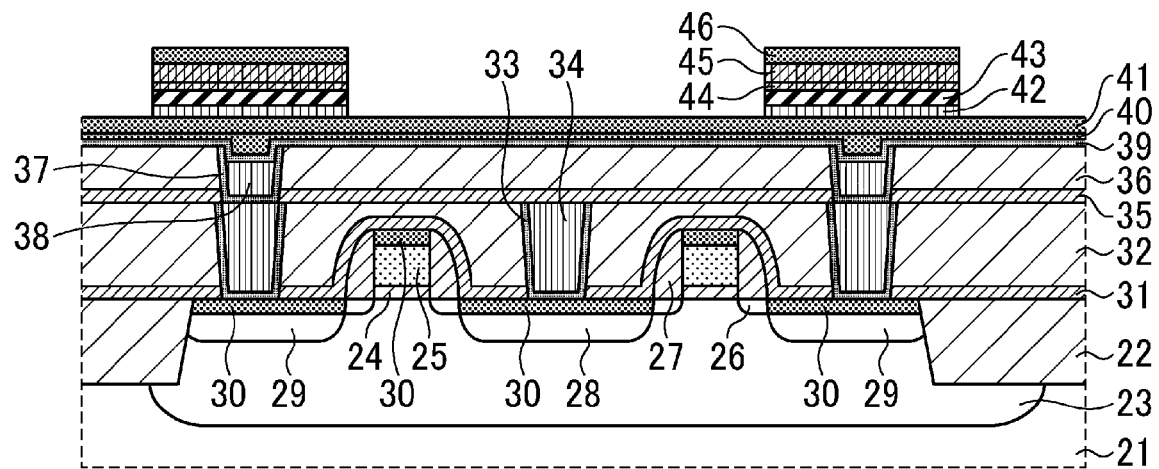
FIGS. 2I and 2J are diagrams for illustrating a step after the step in FIG. 2H of the manufacturing process for a ferroelectric memory device according to the first embodiment of the present invention.
Figure 2J:
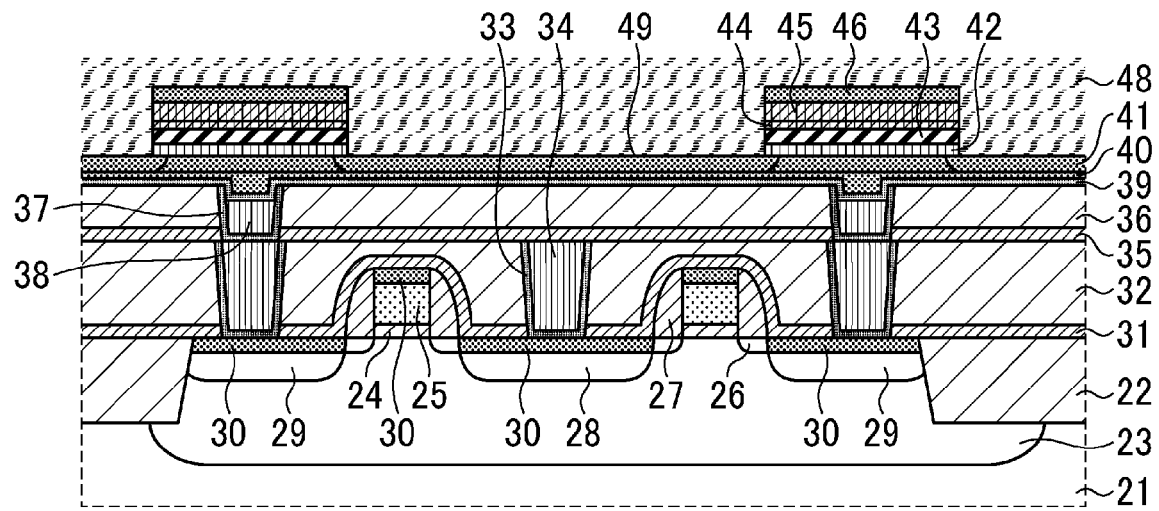

Next, as illustrated in FIG. 2I, the $SiO_2$ film 47 is removed. Then, as illustrated in FIG. 2J, heat treatment is carried out for 60 minutes on the substrate at a temperature of 650° C. in an oxygen atmosphere 48 using dry oxygen. Though the temperature for heat treatment is 650° C. here, the temperature may be 550° C. to 700° C., and this heat treatment restores the PZT film 43 from the damage at the time of film formation and at the time of etching.

At substantially the same time, oxygen enters into the TiAlN film 46 that becomes the lower hard mask and the TiAlN films 41 and 40 that become an oxygen barrier film, and thus, oxygen entering portions 49 are formed. These oxygen entering portions 49 are thicker than the natural oxide formed on the surface exposed from the TiAlN film 46 and the TiAlN film 41. There is a case where the oxygen entering portions 49 are completely oxidized and become an oxide with a stoichiometric composition, or there is a case where the oxide entering portions 49 become an oxide film simply rich with oxygen. Here, oxygen does not enter any further, and therefore, the W plugs 38 formed of W that is easily oxidized are not oxidized. Accordingly, a contact defect can be prevented from being caused, and it becomes possible to increase the yield of the semiconductor device.

Figure 2K:
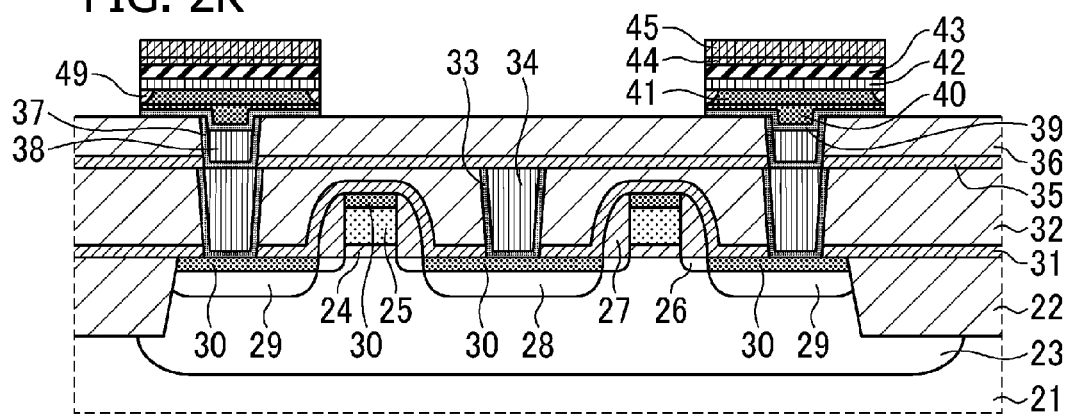
FIGS. 2K and 2L are diagrams for illustrating a step after the step in FIG. 2J of the manufacturing process for a ferroelectric memory device according to the first embodiment of the present invention.

Next, as illustrated in FIG. 2K, the TiAlN film 46, the TiAlN films 41 and 40 as well as the TiN film 39 are removed through plasma etching. At this time, the etching is carried out on the substrate at a temperature of 200° C. under such conditions that a mixed gas of $CF_4$ and oxygen, of which the ratio of the flow rate is 5%:95%, is supplied into the down flow type plasma etching chamber as an etching gas, and at substantially the same time, a high frequency power, of which the frequency is 2.45 GHz and the power is 1400 W, is supplied to the upper electrode of the chamber. Though plasma etching is carried out here, wet etching using a mixed solution of $H_2O_2$, $NH_2OH$, and pure water as the etchant may be carried out. After this process, an oxygen entering portion 49 remains in at least a portion of a side wall of the TiAlN films 41 and 40 as well as the TiN film 39. In the case where the degree of oxidization is high, oxygen entering portions 49 remain on the entirety of the side walls of the TiAlN films 41 and 40 as well as the TiN film 39.

Figure 2L:
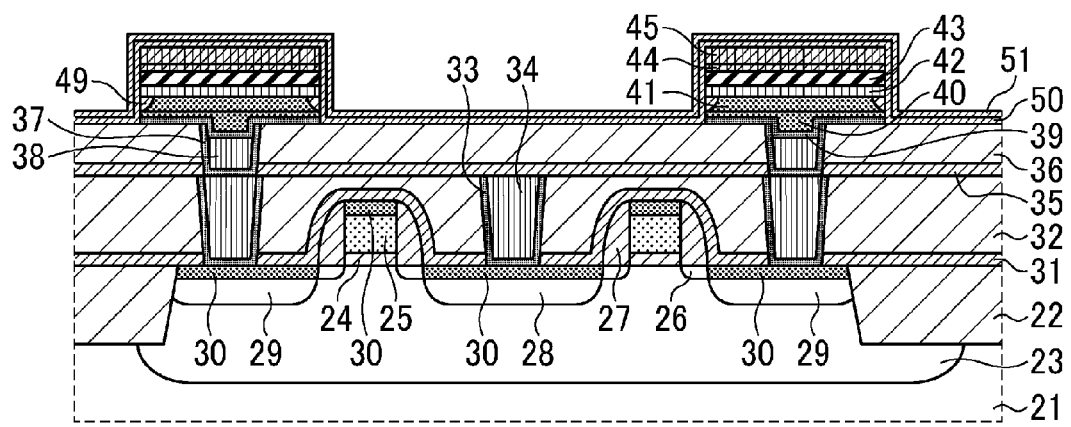

Next, as illustrated in FIG. 2L, an $Al_2O_3$ film 50 with a thickness of 10 nm is formed in accordance with a sputtering method so as to cover the ferroelectric capacitor. Though the thickness of the $Al_2O_3$ film 50 is 10 nm here, the thickness may be 10 nm to 20 nm. After that, a restoration heat treatment is carried out in an oxygen containing atmosphere for the purpose of restoring the PZT film 43 from the damage. Though the conditions for this restoration heat treatment are not particularly limited, the heat treatment here is carried out for 60 minutes in an oxygen atmosphere within a furnace where the temperature of the substrate is 610° C. At this time, an oxygen entering portion 49 is formed on the sides of the TiAlN films 41 and 40 as well as the TiN film 39 located at the lower portion of the ferroelectric capacitor, and therefore, abnormal oxidation does not occur, and thus, such abnormal products in bamboo shoot form as was observed in the conventional process is not generated.

Next, an $Al_2O_3$ film 51 with a thickness of 30 nm is formed on the $Al_2O_3$ film 50 in accordance with an atom layer deposition (ALD) method. Though an ALD method is used here, a CVD method may be used. The $Al_2O_3$ film 50 and the $Al_2O_3$ film 51 work as a hydrogen permeation preventing film.

Figure 2M:
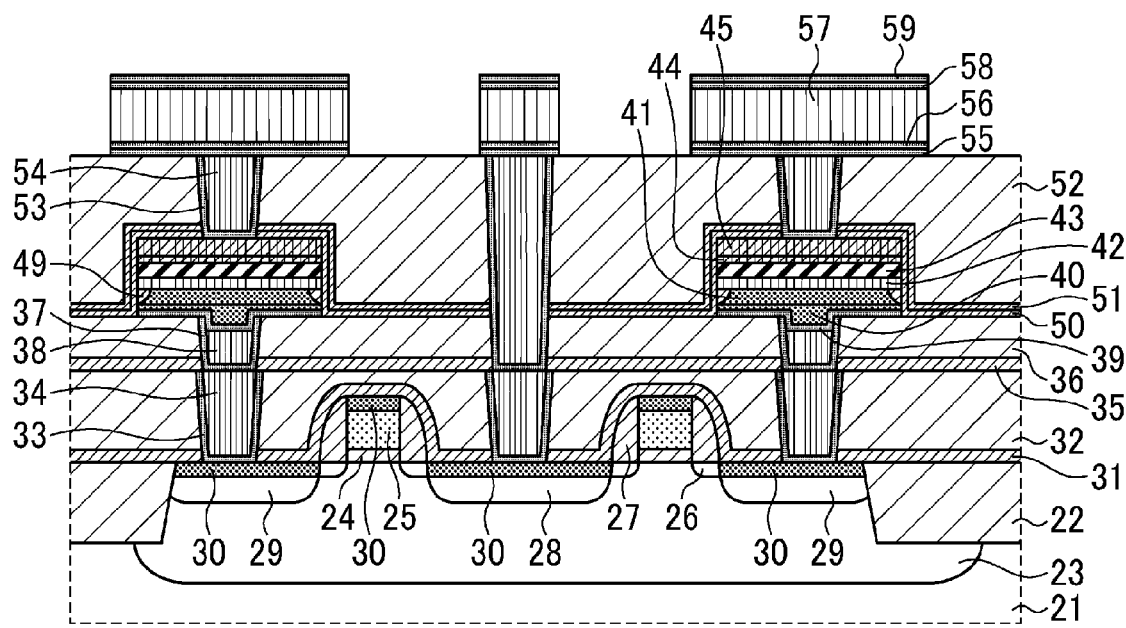
FIG. 2M is a diagram for illustrating a step after the step in FIG. 2L of the manufacturing process for a ferroelectric memory device according to the first embodiment of the present invention.

Next, as illustrated in FIG. 2M, an $SiO_2$ film with a thickness of 1300 nm is deposited in accordance with a plasma CVD method using a mixed gas of TEOS, oxygen, and He and then flattened in accordance with a CMP method so that a third interlayer insulation film 52 is provided. After that, contact holes that reach the W plugs 34 connected to the $IrO_y$ second upper electrodes 45 and the $n^+$ type source region 28 are created. Then, heat treatment is carried out in an oxygen atmosphere at 450° C. so as to restore the PZT film 43 from the oxygen defects that have occurred during the process for creating contact holes.

Next, a Ti film with a thickness of 20 nm and a TiN film with a thickness of 50 nm are layered in this order so as to form a glue film made of a Ti/TiN film 53, and after that, a W film is deposited so as to fill in the contact holes so that the thickness on the flat surface of the third interlayer insulation film 52 becomes 300 nm. Then, a flattening process is carried out in accordance with a CMP method, and thus, W plugs 54 are formed.

Next, a Ti film 55 with a thickness of 60 nm, a TiN film 56 with a thickness of 30 nm, an AlCu alloy film 57 with a thickness of 360 nm, a Ti film 58 with a thickness of 5 nm, and a TiN film 59 with a thickness of 70 nm are layered in this order in accordance with a sputtering method. Then, this multilayer film is etched through photolithography, and thus, a first metal wire layer connected to the W plugs 54 is formed. After that, the process for forming an interlayer insulation film, the process for forming conductive plugs, and the process for forming a metal wire layer are repeated for the number of preferable wire layers. Finally, a cover film made of a TEOS oxide film and an SiN film is formed, and thus, the basic structure of the ferroelectric memory device according to the first embodiment is complete.

According to the first embodiment of the present invention, an oxygen entering portion 49 is formed on the sides of the TiAlN films 41 and 40, which work as an oxygen barrier film, as well as the TiN film 39, which is a crystallinity increasing conductive adhesive film, prior to the heat treatment process for restoring the PZT from the damage, and therefore, abnormal oxidation does not occur. As a result, abnormal products in bamboo shoot form is not generated, and therefore, the coating properties of the $Al_2O_3$ films 50 and 51 that work as a hydrogen permeation preventing film do not deteriorate, and the plugs can be prevented from abnormally oxidizing.

As described above, abnormal oxidation does not occur, and therefore, the contact resistance of the W plugs 34 and the Ir lower electrodes 42 does not increase. In addition, it is possible to carry out a stable crystallinity restoring process, which can prevent the switching properties of the ferroelectric capacitors from lowering, which makes it possible to improve the yield of the device.

Second Embodiment

Figure 3:
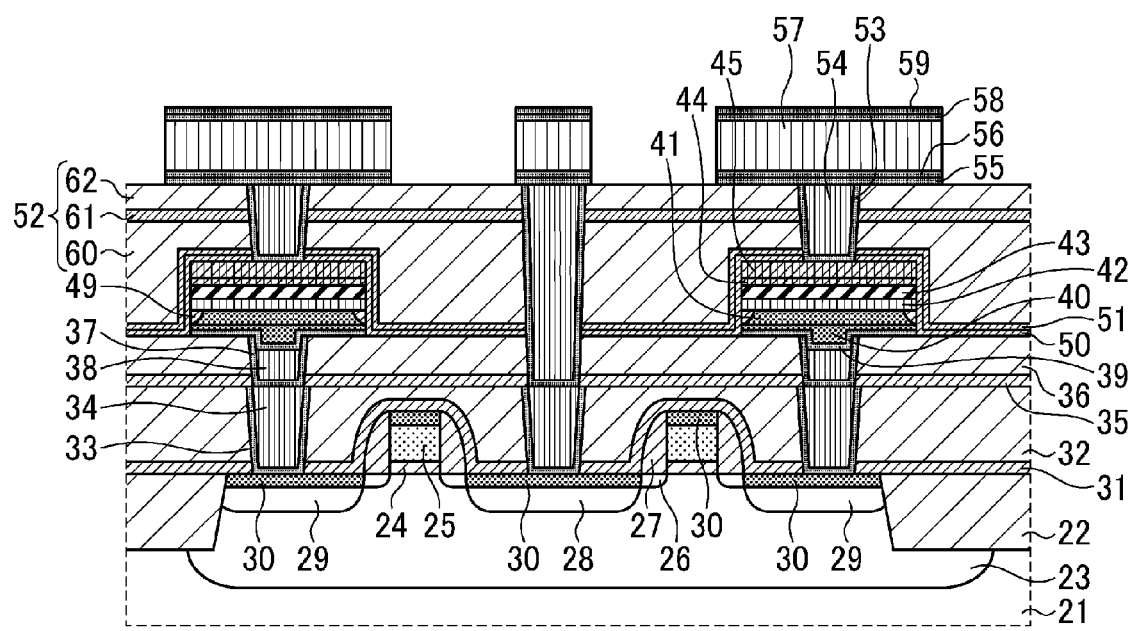
FIG. 3 is a schematic cross-sectional diagram illustrating the ferroelectric memory device according to the second embodiment of the present invention.

Next, the ferroelectric memory device according to the second embodiment of the present invention is described in reference to FIG. 3. The second embodiment provides substantially the same ferroelectric memory device as in the first embodiment, except that a hydrogen permeation preventing film is provided in the third interlayer insulation film, and therefore, only the final structure is described. FIG. 3 is a schematic cross-sectional diagram illustrating the ferroelectric memory device according to the second embodiment of the present invention. In the process for forming a third interlayer insulation film 52, first, an $SiO_2$ film 60 is formed and then flattened in accordance with a CMP method. Subsequently, an $Al_2O_3$ film 61 with a thickness of 50 nm, for example, which is in a range from 30 nm to 100 nm, is formed so as to work as a hydrogen permeation preventing film, and then, another $SiO_2$ film 62 is formed and flattened in accordance with a CMP method, and thus, a third interlayer insulation film 52 with a three-layer structure is provided. After that, conductive plugs and a metal wire layer are formed in substantially the same manner as in the first embodiment.

According to the second embodiment of the present invention, a hydrogen permeation preventing film is provided on the ferroelectric capacitors so that the hydrogen from the metal wire layer is blocked by the $Al_2O_3$ film 61, which works as the hydrogen permeation preventing film, and therefore, the ferroelectric capacitors are more resilient against deterioration during the manufacturing process.

Third Embodiment

Figure 4A:
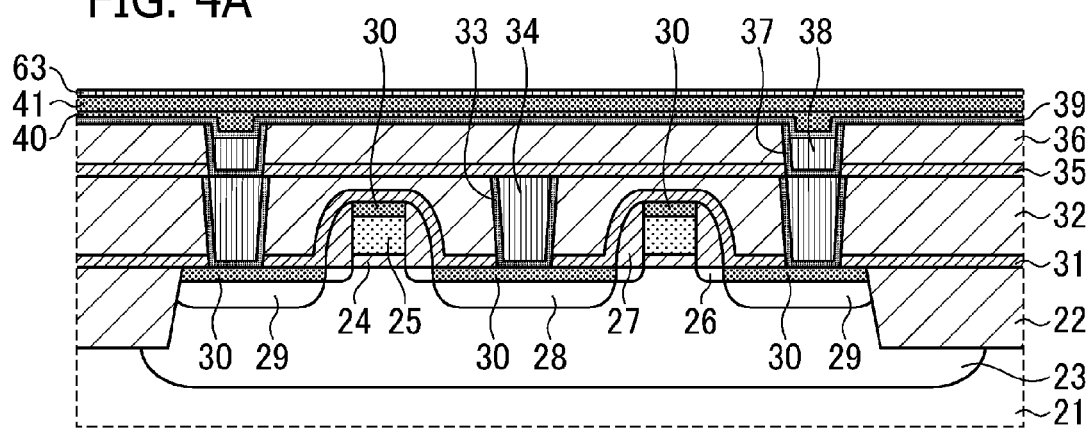
FIGS. 4A and 4B are diagrams for illustrating a step in the middle of the manufacturing process for a ferroelectric memory device according to the third embodiment of the present invention.

Next, the manufacturing process for a ferroelectric memory device according to the third embodiment of the present invention is described in reference to FIGS. 4A to 4I. First, as illustrated in FIG. 4A, an Ir film 63 with a thickness of 20 nm is formed on a TiAlN film 41 in accordance with a sputtering method in substantially the same steps as the step in FIG. 2E in the first embodiment.

Figure 4B:
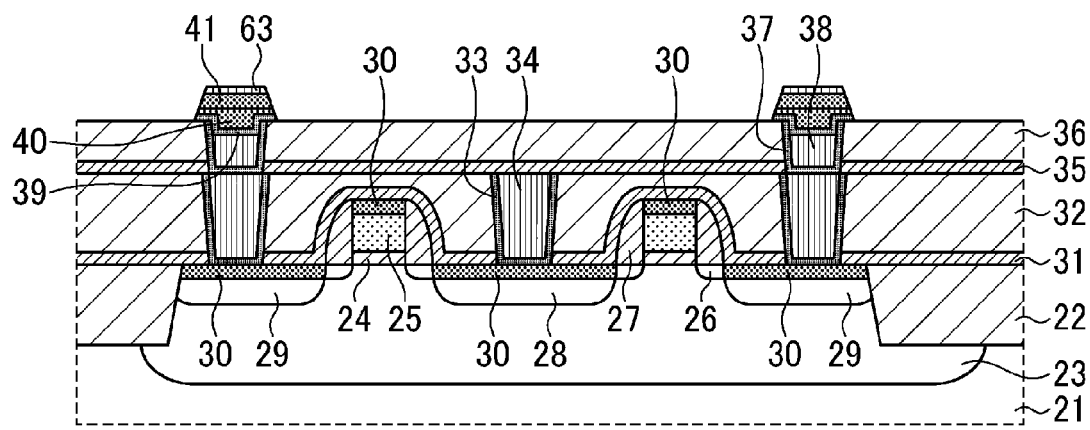

Next, as illustrated in FIG. 4B, the Ir film 63 and the TiN film 39 as well as the films between them located above the W plugs 38 are etched using a resist, a hard mask, and a photolithographic technology to a pattern, of which the size is greater than that of the W plugs 38 and smaller than the capacitors.

Figure 4C:
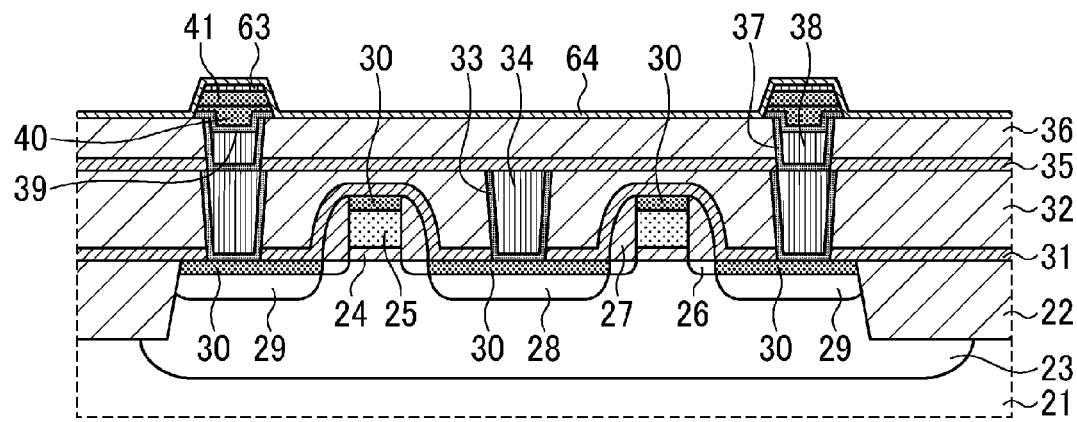
FIGS. 4C and 4D are diagrams for illustrating a step after the step in FIG. 4B of the manufacturing process for a ferroelectric memory device according to the third embodiment of the present invention.

Next, as illustrated in FIG. 4C, a $TiO_2$ film 64 with a thickness of 30 nm having oxygen barrier properties is formed on the entire surface in accordance with a sputtering method. Though the thickness of the $TiO_2$ film 64 is 30 nm here, the thickness may be 20 nm to 50 nm. In addition, the film may be made of any of $Al_2O_3$, $TaO_x$, $HfO_x$, SiON, IrSiON, and RuSiON as long as the film is an insulation film having oxygen barrier properties.

Figure 4D:
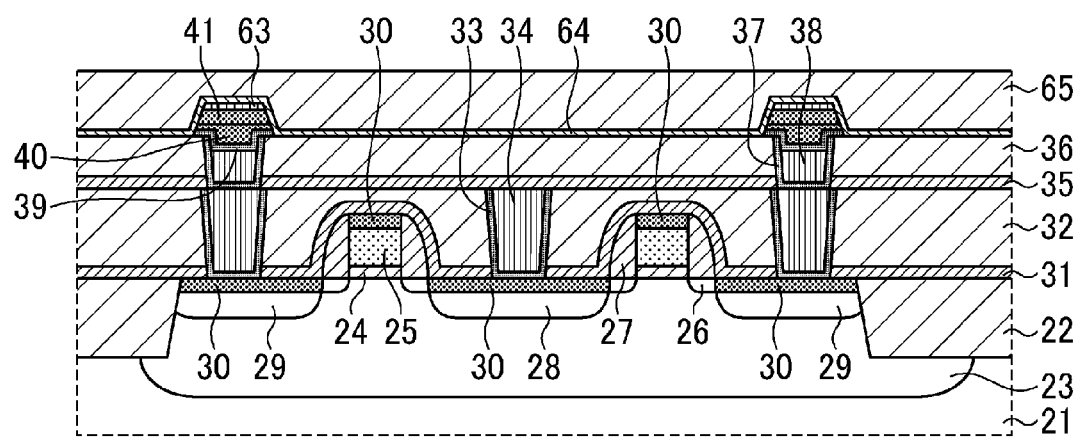

Next, as illustrated in FIG. 4D, an $SiO_2$ film 65 with a thickness of 1000 nm is formed in accordance with a plasma CVD method using a mixed gas of TEOS, oxygen, and He.

Figure 4E:
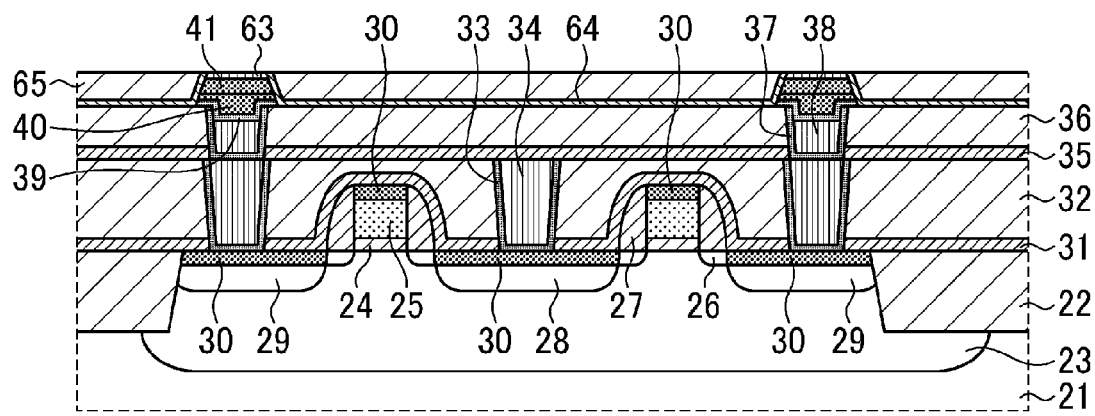
FIGS. 4E and 4F are diagrams for illustrating a step after the step in FIG. 4D of the manufacturing process for a ferroelectric memory device according to the third embodiment of the present invention.
Figure 4F:
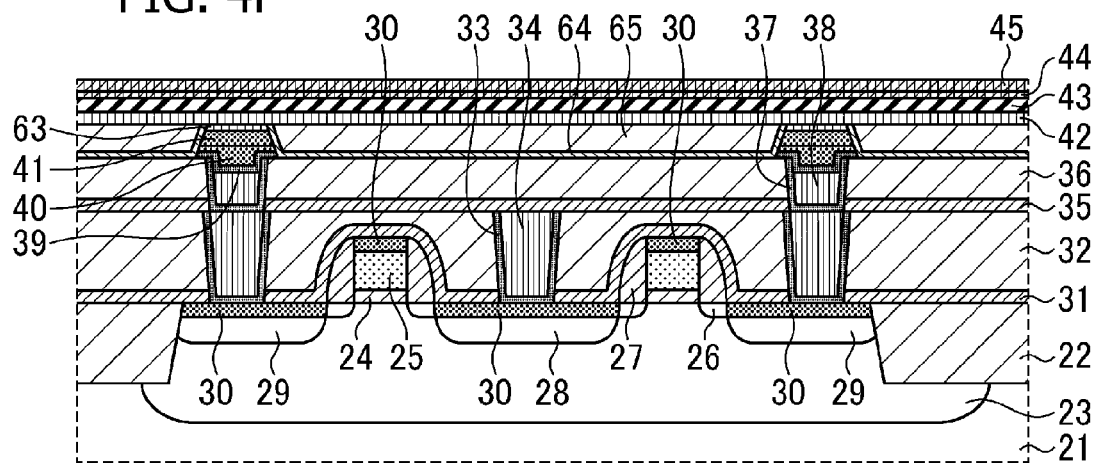

Next, as illustrated in FIG. 4E, the $SiO_2$ film 65 is flattened in accordance with a CMP method using the Ir film 63 as a stopper, and thus, the $TiO_2$ film 64 is removed from the Ir film 63. After that, as illustrated in FIG. 4F, an Ir lower electrode 42, a PZT film 43, an $IrO_x$ first upper electrode 44, and an $IrO_y$ second upper electrode 45 are formed in substantially the same process for forming films as in the first embodiment.

Figure 4G:
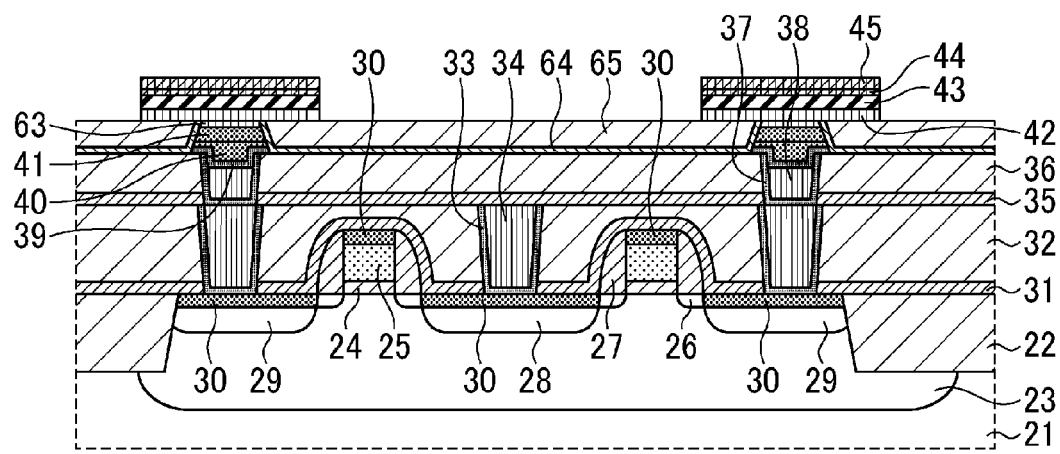
FIGS. 4G and 4H are diagrams for illustrating a step after the step in FIG. 4F of the manufacturing process for a ferroelectric memory device according to the third embodiment of the present invention.

Next, as illustrated in FIG. 4G, the $IrO_y$ second upper electrode 45 and the Ir lower electrode 42 and the films between them are collectively etched using a hard mask made of an $SiO_2$ film (not shown) as the mask so as to form ferroelectric capacitors, and then, the hard mask is removed.

Next, heat treatment is carried out at 410° C. for 40 minutes in an atmosphere that includes oxygen in order to restore the PZT film 43 from the damage received at the time of film formation and at the time of etching. At this time, the sides of the TiAlN films 41 and 40 as well as the TiN film 39 are covered with the $TiO_2$ film 64 having oxygen barrier properties, and therefore, abnormal oxidation does not occur and the W plugs 38 are not oxidized.

Figure 4H:
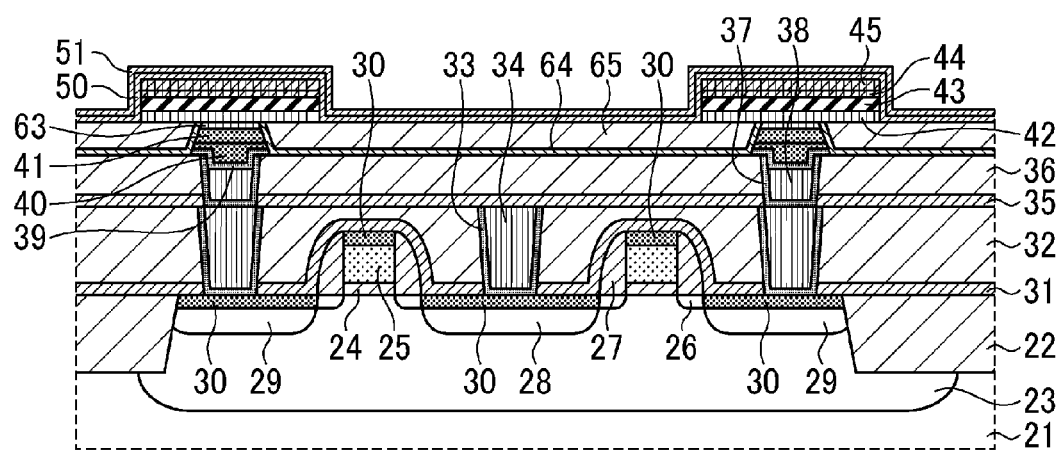

After that, as illustrated in FIG. 4H, an $Al_2O_3$ film 50 and an $Al_2O_3$ film 51 that work as a hydrogen permeation preventing film are layered in this order in substantially the same process as the process illustrated in FIG. 2L in the first embodiment.

Figure 4I:
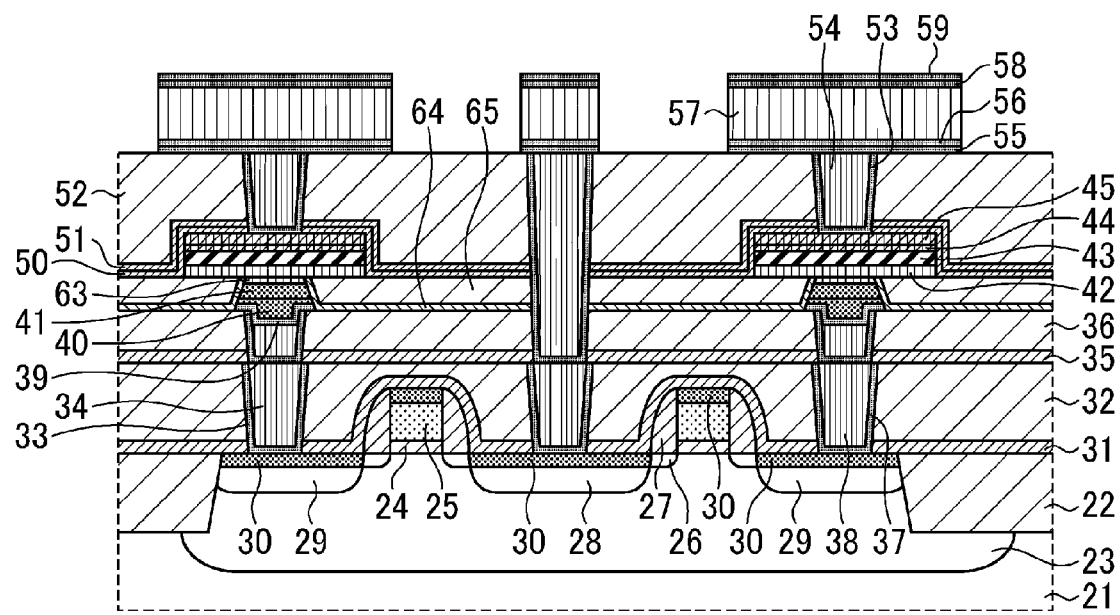
FIG. 4I is a diagram for illustrating a step after the step in FIG. 4H of the manufacturing process for a ferroelectric memory device according to the third embodiment of the present invention.

Next, as illustrated in FIG. 4I, a third interlayer insulation film 52, conductive plugs, and a first metal wire layer are formed in substantially the same process as the process in FIG. 2M in the first embodiment. After that, the process for forming an interlayer insulation film, the process for forming conductive plugs, and the process for forming a metal wire layer are repeated for the number of preferable wire layers. Finally, a cover film is formed of a TEOS oxide film and an SiN film, and thus, the basic structure of the ferroelectric memory device according to the third embodiment is complete.

According to the third embodiment of the present invention, the TiAlN films 41 and 40 that work as an oxygen barrier film are processed in advance to have a small size through etching, and therefore, the height of the ferroelectric capacitors can be kept low at the time of collective etching. As a result, ferroelectric capacitors with a large taper angle can be formed, and therefore, ferroelectric capacitors having substantially the same capacitors can be formed in smaller areas.

In addition, in the heat treatment process for restoring the PZT film from the damage at the time of film formation and at the time of etching, the sides of the TiAlN films 41 and 40 as well as the TiN film 39 are covered with a $TiO_2$ film 64 having oxygen barrier properties, and therefore, abnormal oxidation does not occur and the W plugs 38 are not oxidized.

Fourth Embodiment

Figure 5:
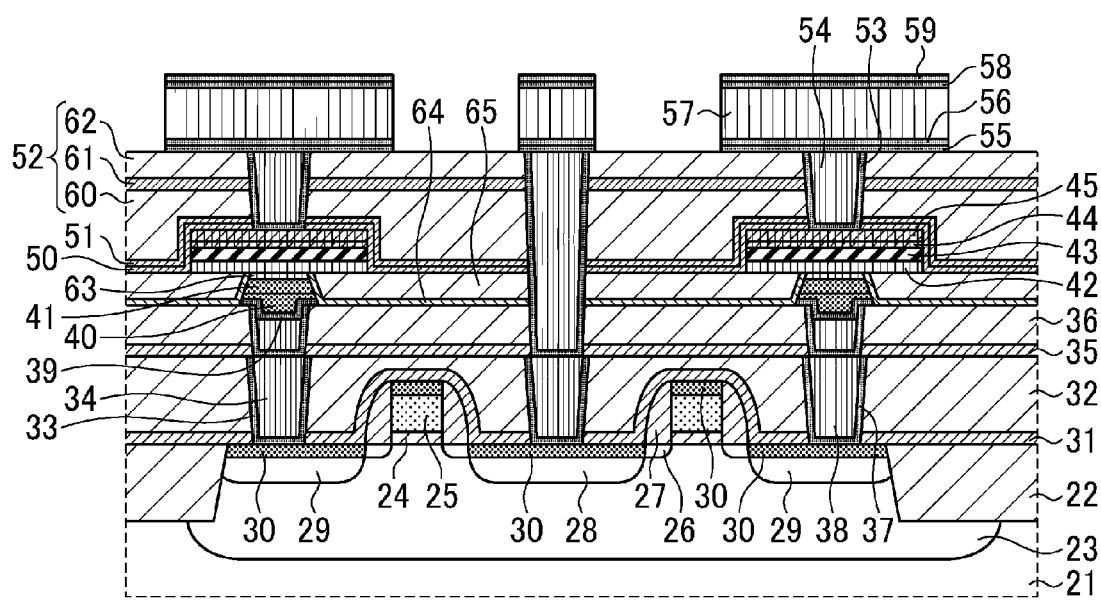
FIG. 5 is a schematic cross-sectional diagram illustrating the ferroelectric memory device according to the forth embodiment of the present invention.

Next, the ferroelectric memory device according to the fourth embodiment of the present invention is described in reference to FIG. 5. The fourth embodiment provides substantially the same ferroelectric memory device as the third embodiment, except that a hydrogen permeation preventing film is provided in the third interlayer insulation film in the ferroelectric memory device according to the third embodiment in substantially the same manner as in the second embodiment, and therefore, only the final structure is described. FIG. 5 is a schematic cross-sectional diagram illustrating the ferroelectric memory device according to the fourth embodiment of the present invention. In the process for forming a third interlayer insulation film 52, first, an $SiO_2$ film 60 is formed and then flattened in accordance with a CMP method. After that, an $Al_2O_3$ film 61 with a thickness of 50 nm, which is in a range from 30 nm to 100 nm, is formed so as to work as a hydrogen permeation preventing film, and then, another $SiO_2$ film 62 is formed and flattened in accordance with a CMP method so that a third interlayer insulation film 52 with a three-layer structure is provided. After that, conductive plugs and a metal wire layer are formed in substantially the same manner as in the first embodiment.

According to the fourth embodiment of the present invention as well, a hydrogen permeation preventing film is provided on the ferroelectric capacitors so that the hydrogen from the metal wire layer is blocked by the $Al_2O_3$ film 61, which works as the hydrogen permeation preventing film, and therefore, the ferroelectric capacitors are more resilient against deterioration during the manufacturing process.

Fifth Embodiment

Next, the ferroelectric memory device according to the fifth invention of the present invention is described in reference to FIGS. 6A to 9C. First, the manufacturing process for the ferroelectric memory device according to the fifth embodiment of the present invention is described in reference to FIGS. 6A to 6E. Initially, the structure up to the $IrO_y$ second upper electrode 45 is formed in substantially the same steps as the steps in FIGS. 2A to 2G in the first embodiment.

Figure 6A:
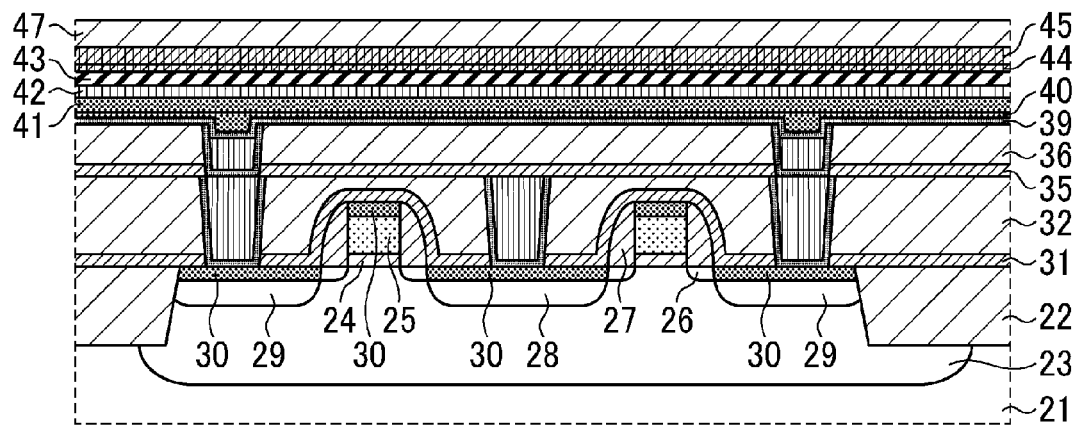
FIGS. 6A and 6B are diagrams for illustrating a step in the middle of the manufacturing process for a ferroelectric memory device according to the fifth embodiment of the present invention.
Figure 6B:
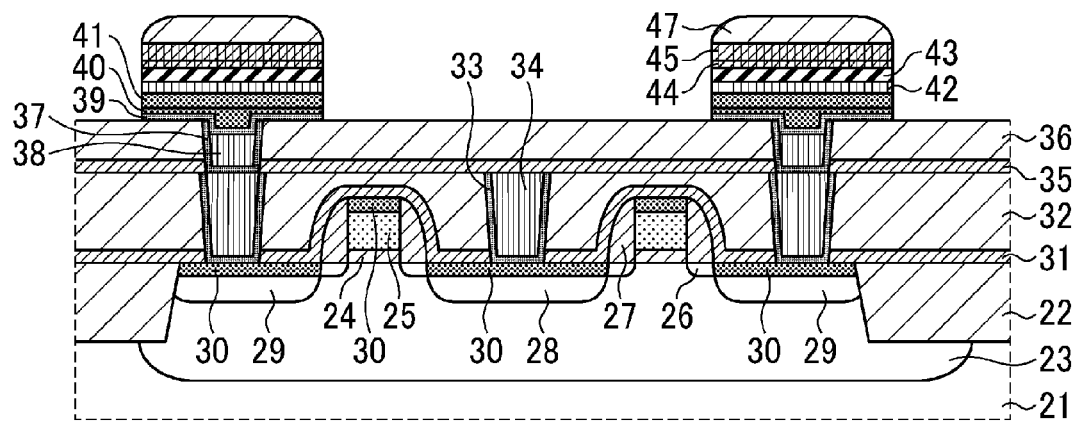

Next, as illustrated in FIG. 6B, the $IrO_y$ second upper electrode 45 and the TiN film 39 as well as the films between them are collectively etched using the $SiO_2$ film 47 as a hard mask, and thus, ferroelectric capacitors are formed.

Figure 6C:
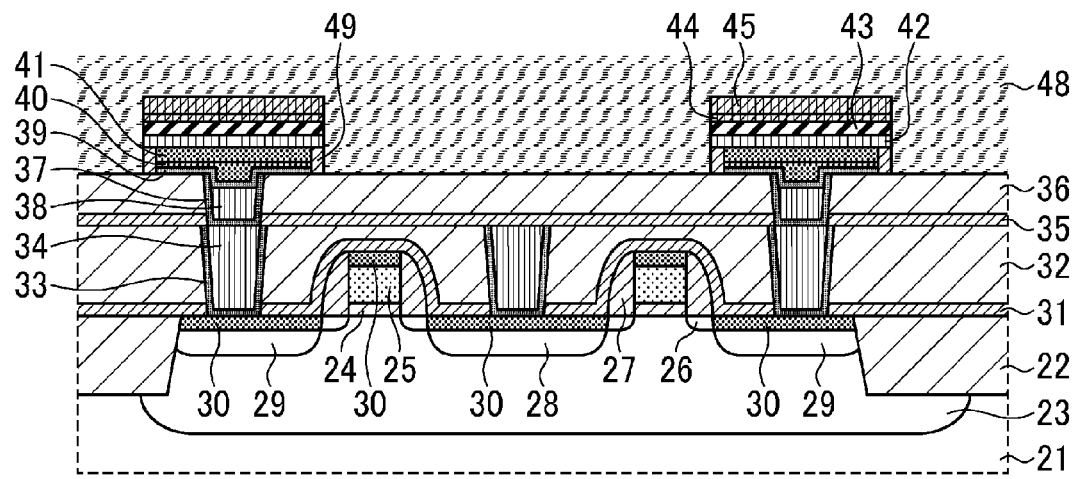
FIGS. 6C and 6D are diagrams for illustrating a step after the step in FIG. 6B of the manufacturing process for a ferroelectric memory device according to the fifth embodiment of the present invention.

Next, as illustrated in FIG. 6C, the $SiO_2$ film 47 is removed, and then, heat treatment is carried out at 450° C. for 10 hours in a dry oxygen atmosphere so as to gradually oxidize the sides of the TiAlN films 41 and 40 as well as the TiN film 39, and thus, oxygen entering portions 49 are formed. Though heat treatment is carried out at 450° C. here, the temperature may be 400° C. to 500° C. In the case when the temperature is 400° C. or lower, the TiAlN films 41 and 40 are hardly oxidized, and therefore, abnormal products in bamboo shoot form is generated in the high temperature heat treatment process in the following steps. Meanwhile, in the case where the temperature is higher than 500° C., abnormal products in bamboo shoot form is generated during this heat treatment stage. The sides of the TiAlN films 41 and 40 are oxidized very slowly, and therefore, it is preferable for the treatment to be carried out over a long period of time.

Next, heat treatment is carried out at 610° C., which is higher than 500° C., in order to restore the PZT film 43 from the damage. At this time, an oxygen entering portion 49 is formed on the sides of the TiAlN films 41 and 40 as well as the TiN film 39, and therefore, abnormal products in bamboo shoot form is not generated during this heat treatment.

Figure 6D:
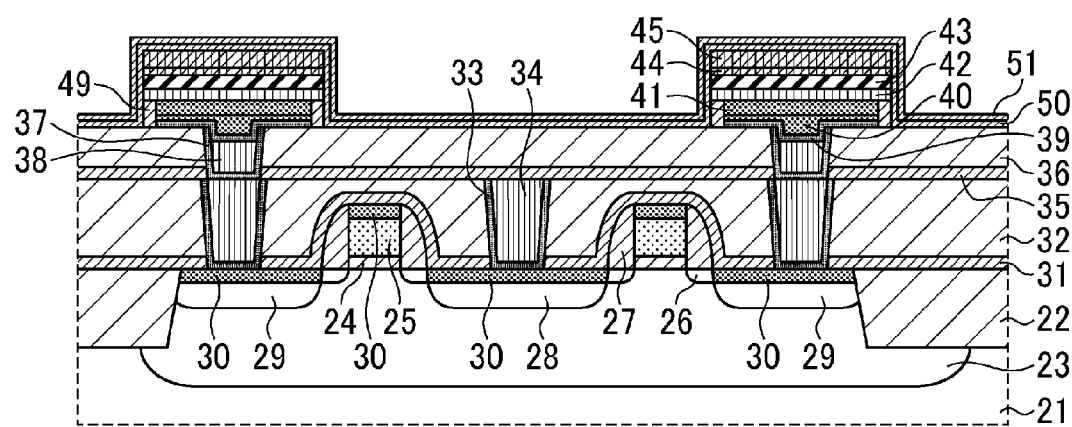

After that, as illustrated in FIG. 6D, an $Al_2O_3$ film 50 and an $Al_2O_3$ film 51 are layered in this order so as to work as a hydrogen permeation preventing film in substantially the same process as the process illustrated in FIG. 2L in the first embodiment.

Figure 6E:
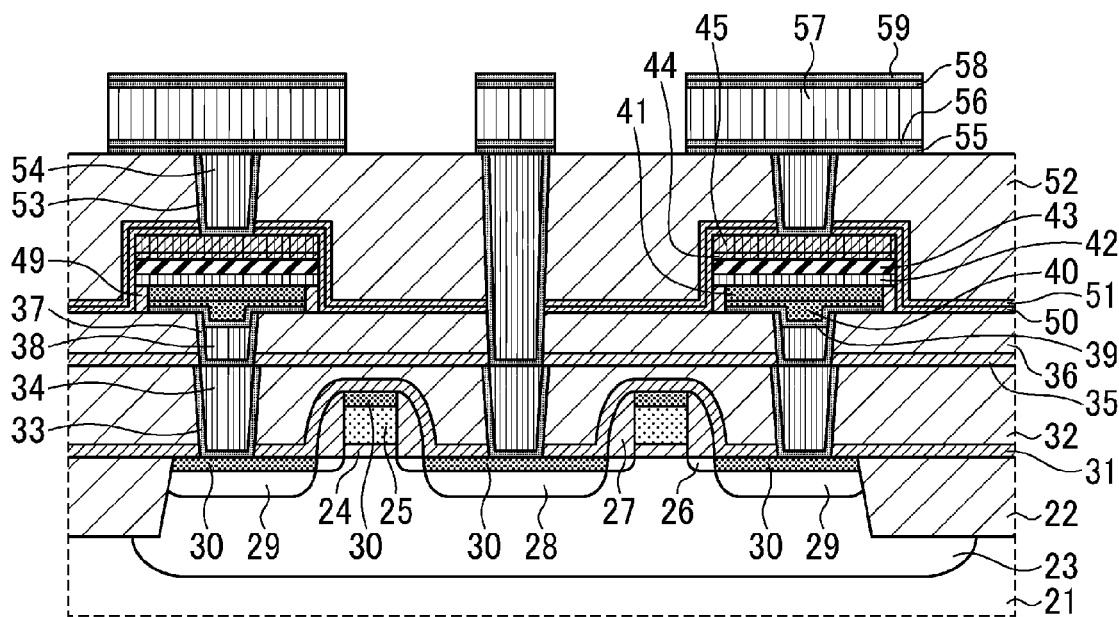
FIG. 6E is a diagram for illustrating a step after the step in FIG. 6D of the manufacturing process for a ferroelectric memory device according to the fifth embodiment of the present invention.

Next, as illustrated in FIG. 6E, a third interlayer insulation film 52, conductive plugs, and a first metal wire layer are formed in substantially the same process as the process in FIG. 2M in the first embodiment. After that, the process for forming an interlayer insulation film, the process for forming conductive plugs, and the process for forming a metal wire layer are repeated for the number of preferable wire layers. Finally, a cover film is formed of a TEOS oxide film and an SiN film, and thus, the basic structure of the ferroelectric memory device according to the fifth embodiment is complete.

Figure 7A:
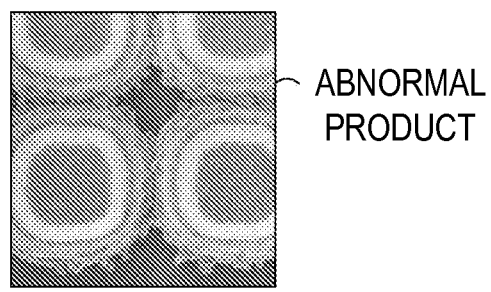
FIGS. 7A to 7D are images depicting the state where abnormal products are generated in the fifth embodiment of the present invention.
Figure 7A:
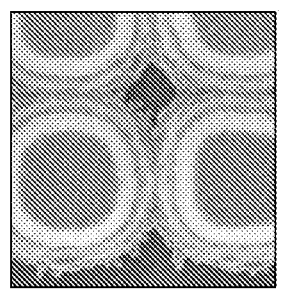

Next, the working effects in the fifth embodiment of the present invention are described in reference to FIGS. 7A to 9C. FIGS. 7A to 7D are images depicting the state where abnormal products are generated in the fifth embodiment of the present invention. FIG. 7A is a SEM image of the surface after heat treatment at 610° C. for 40 minutes instead of heat treatment at 450° C. for 10 hours following collective etching as described above. As depicted in the image, a large number of bamboo shoots of abnormal product are generated between the ferroelectric capacitors in substantially the same manner as in the conventional manufacturing process.

Figure 7B:
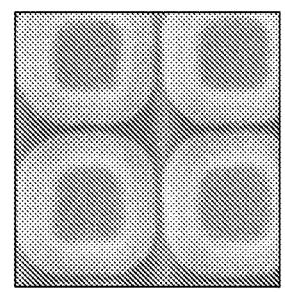
Figure 7B:
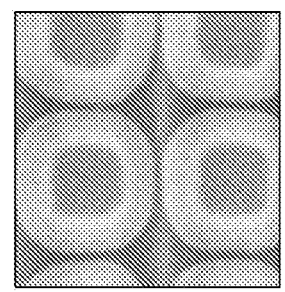
Figure 7C:
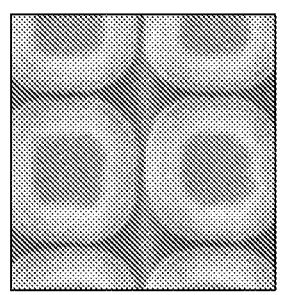
Figure 7C:
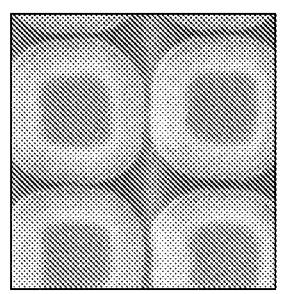
Figure 7D:
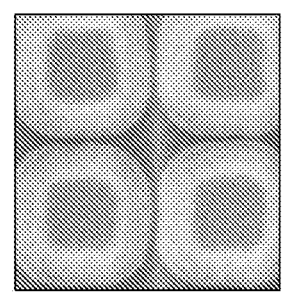
Figure 7D:
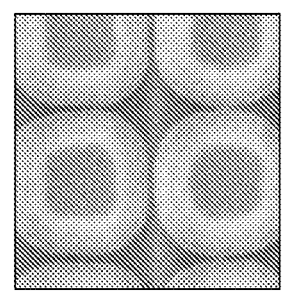

FIG. 7B is a SEM image of the surface immediately after heat treatment at 450° C. for 10 hours, where abnormal products in bamboo shoot form is not generated and such a state is gained where the space between the ferroelectric capacitors is clear. FIG. 7C is a SEM image of the surface after heat treatment at 400° C. for 10 hours followed by heat treatment at 610° C. for forty minutes. As illustrated in the image, abnormal products in bamboo shoot form is not generated and such a state is gained that the space between the ferroelectric capacitors is clear. FIG. 7D is a SEM image of the surface after heat treatment at 400° C. for 10 hours followed by heat treatment at 650° C. for forty minutes. As illustrated in the image, abnormal products in bamboo shoot form is not generated and such a state is gained that the space between the ferroelectric capacitors is clear. Thus, from the comparison between FIG. 7A and FIGS. 7B to 7D, the working effects of oxidation at a low temperature for a long period of time are confirmed.

Figure 8A:
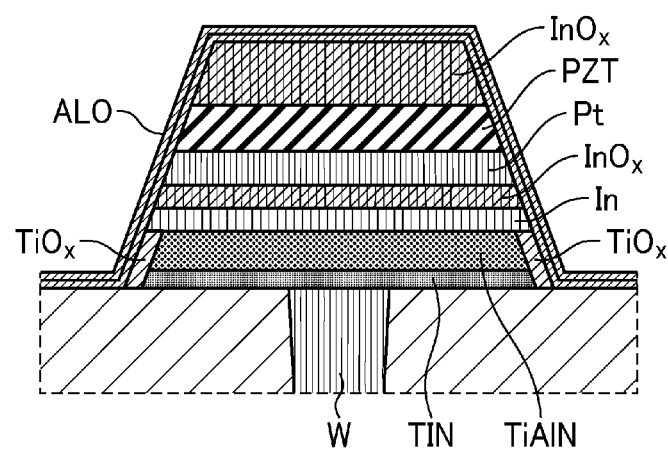
FIGS. 8A and 8B are a diagram and an image illustrating a cross-section of the capacitor structure according to the fifth embodiment of the present invention
Figure 8B:
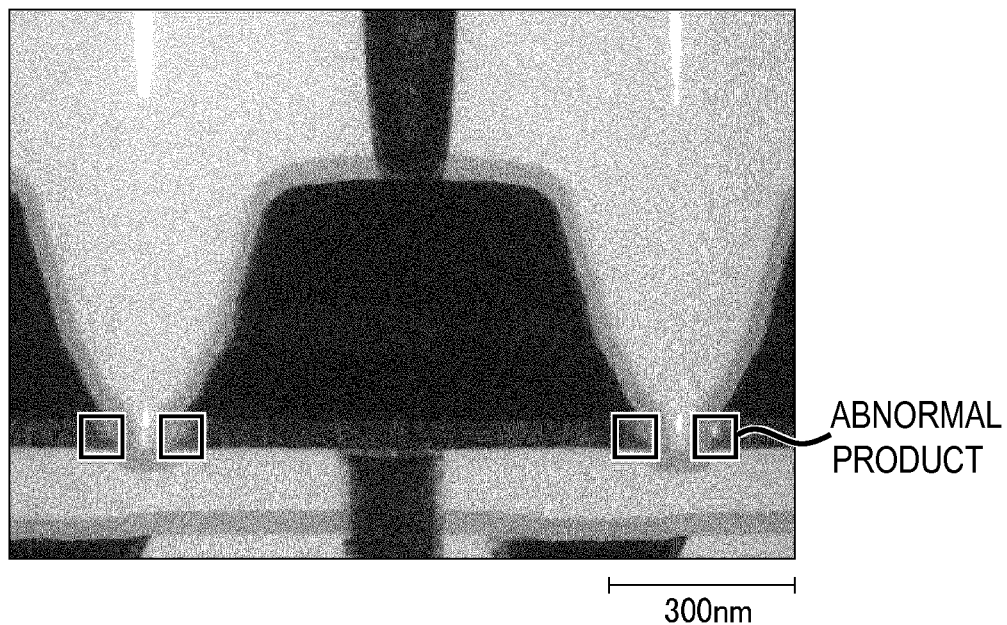

FIGS. 8A and 8B are a diagram and an image illustrating a cross-section of the capacitor structure according to the fifth embodiment of the present invention. FIG. 8A illustrates a cross-section of the concrete structure, and FIG. 8B is a corresponding TEM image. Here, as illustrated in FIG. 8A, the lower electrode has a three-layer structure of $Ir/IrO_x/Pt$. In addition, Ti is oxidized with priority over Al during oxidation at a low temperature in the oxygen entering portions in the side walls of the TiAlN film, which therefore substantially become regions with a $TiO_x$ composition. Here, Al is oxidized more significantly during oxidation at a high temperature, which is assumed to be the cause of the generation of abnormal products (abnormal oxide) in bamboo shoot form. In addition, abnormal products in bamboo shoot form are not confirmed from the cross-sectional TEM image in FIG. 8B.

Figure 9A:
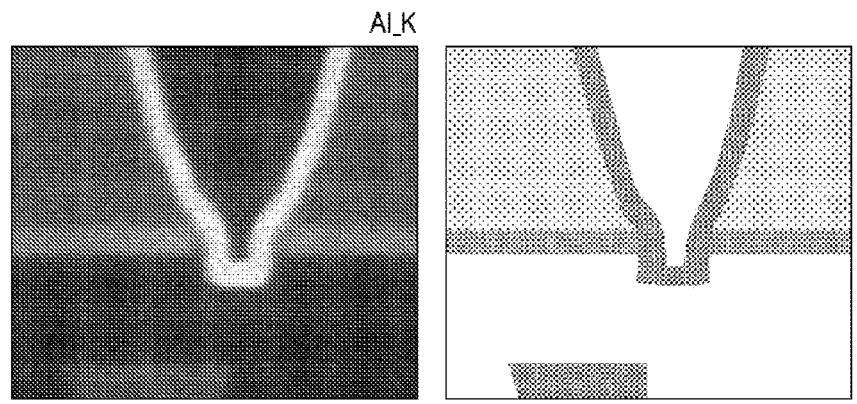
FIGS. 9A to 9C are images and diagrams showing element distribution in a cross-section of the capacitor structure according to the fifth embodiment of the present invention.
Figure 9B:
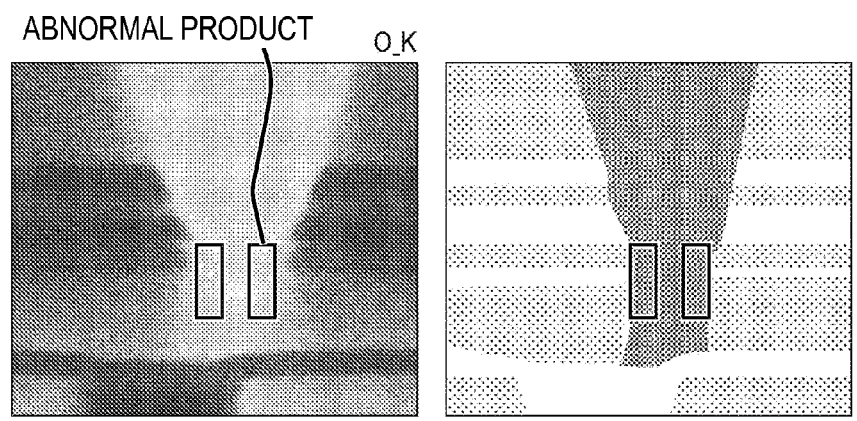
Figure 9C:
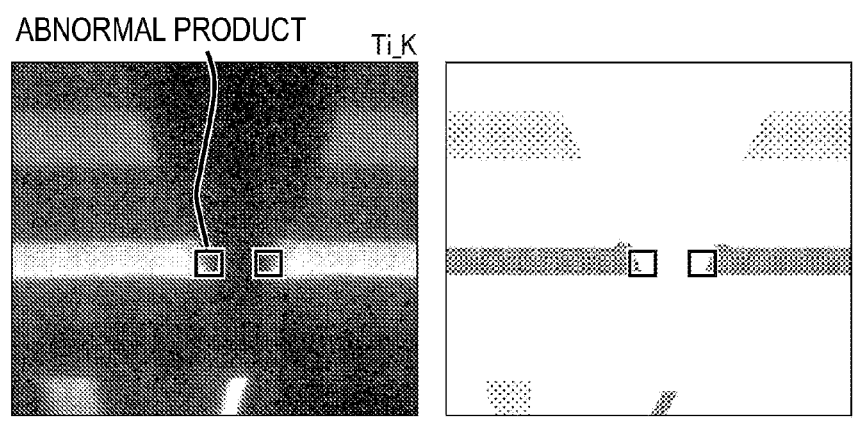

FIGS. 9A to 9C are images and diagrams showing element distribution in a cross-section of the capacitor structure according to the fifth embodiment of the present invention. The left image in each figure is an image resulting from energy dispersive X-ray spectrometry (EDX) that depicts EDX mapping of the concentrations of Al, O, and Ti, and the right diagram is an illustration of the EDX mapping. FIG. 9A depicts the distribution of the concentration of Al, and it can be seen that the concentration of Al is high in the locations corresponding to the $Al_2O_3$ films (50, 51) and the TiAlN films (41 and 40).

FIG. 9B depicts the distribution of the concentration of O, and an oxide is observed in the locations corresponding to the side walls of the TiAlN films (41, 40) within the two rectangular boxes, of which the vertical sides are longer than the lateral sides, in each figure. In addition, FIG. 9C depicts the distribution of the concentration of Ti where the concentration of Ti is high in the locations corresponding to the TiAlN films (41, 40) and the TiN film (39). Ti is also confirmed in the locations in the two square boxes in each figure corresponding to the side walls of the TiAlN films (41, 40) and the TiN film (39). Judging from FIGS. 9A to 9C collectively, though a Ti oxide and an Al oxide are confirmed on the sides of the TiAlN films and the TiN film, an abnormal product in bamboo shoot form is not generated as in the conventional method.

In the fifth embodiment of the present invention, the ferroelectric capacitors are oxidized at a low temperature over a long period of time after collective etching, and therefore, abnormal products are not generated on the sides even in the case where high temperature heat treatment is carried out in the following process. As a result, conductive plugs can be prevented from being abnormally oxidized, and in addition, the contact resistance between the conductive plugs and the lower electrodes can be prevented from increasing during the heat treatment for restoring the PZT film from the damage, and thus, the switching properties of the capacitors can be prevented from lowering and the yield of the device can be increased.

Sixth Embodiment

Figure 10:
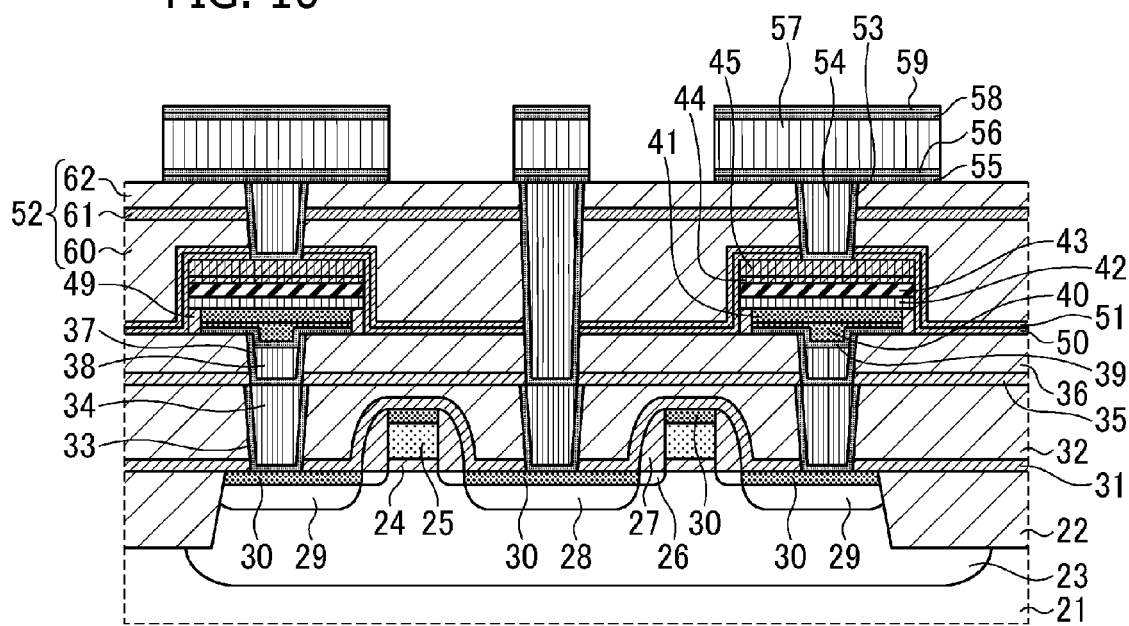
FIG. 10 is a schematic cross-sectional diagram illustrating the ferroelectric memory device according to the sixth embodiment of the present invention.

Next, the ferroelectric memory device according to the sixth embodiment of the present invention is described in reference to FIG. 10. The sixth embodiment provides substantially the same ferroelectric memory device as the fifth embodiment, except that a hydrogen permeation preventing film is provided in the third interlayer insulation film of the ferroelectric memory device according to the fifth embodiment in substantially the same manner as in the second embodiment, and therefore, only the final structure is described. FIG. 10 is a schematic cross-sectional diagram illustrating the ferroelectric memory device according to the sixth embodiment of the present invention. In the process for forming a third interlayer insulation film 52, first, an $SiO_2$ film 60 is formed, and then flattened in accordance with a CMP method. Subsequently, an $Al_2O_3$ film 61 with a thickness of 50 nm, which is in a range from 30 nm to 100 nm, is formed so as to work as a hydrogen permeation preventing film, and then, another $SiO_2$ film 62 is formed and flattened in accordance with a CMP method so that a third interlayer insulation film 52 with a three-layer structure is provided. After that, conductive plugs and a metal wire layer are formed in substantially the same manner as in the first embodiment.

In the sixth embodiment of the present invention as well, a hydrogen permeation preventing film is provided on the ferroelectric capacitors so that the hydrogen from the metal wire layer is blocked by the $Al_2O_3$ film 61, which works as the hydrogen permeation preventing film, and therefore, the ferroelectric capacitors are more resilient against deterioration during the manufacturing process.

Seventh Embodiment

Figure 11:
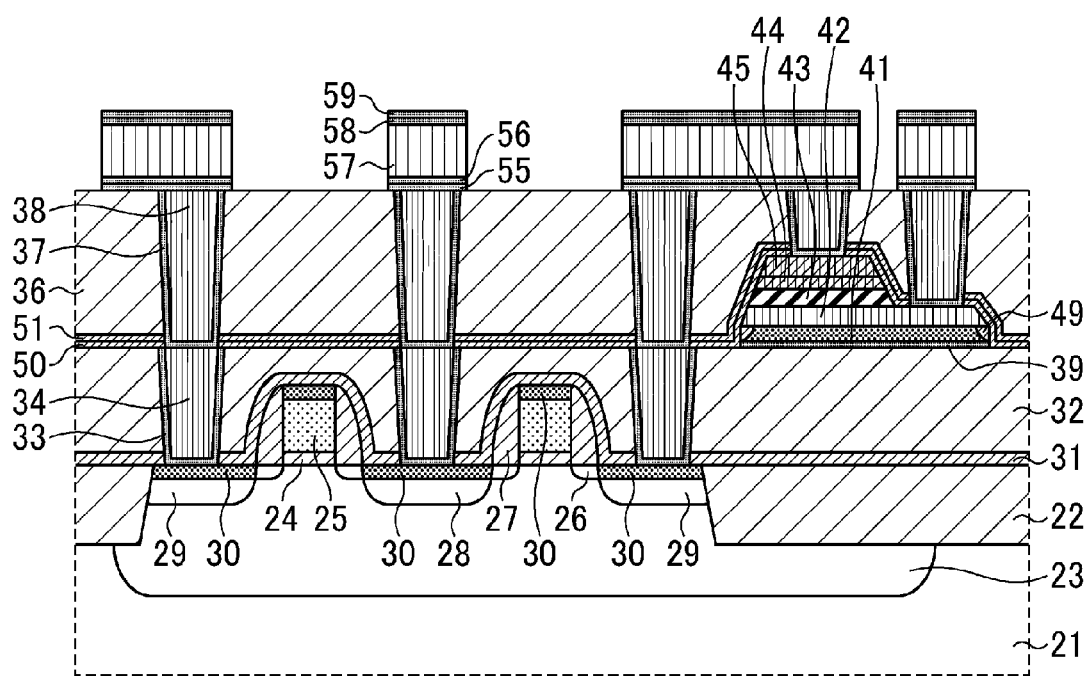
FIG. 11 is a schematic cross-sectional diagram showing the ferroelectric memory device according to the seventh embodiment of the present invention.
Figure 12A:
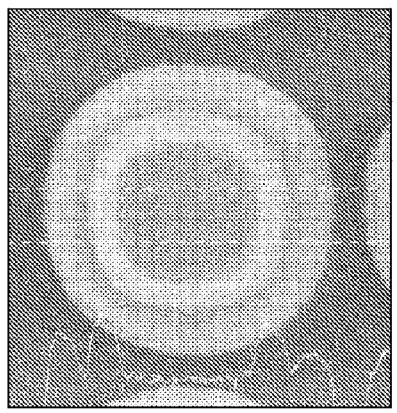
FIGS. 12A to 12C are images depicting the situation where abnormal products have been generated in a conventional ferroelectric capacitor.
Figure 12B:
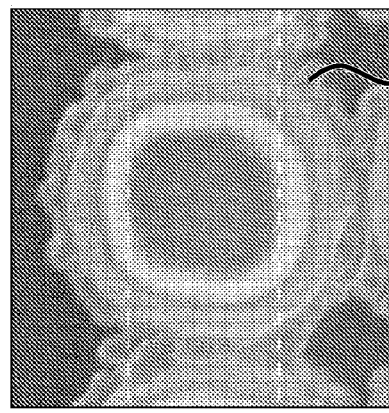
Figure 12C:
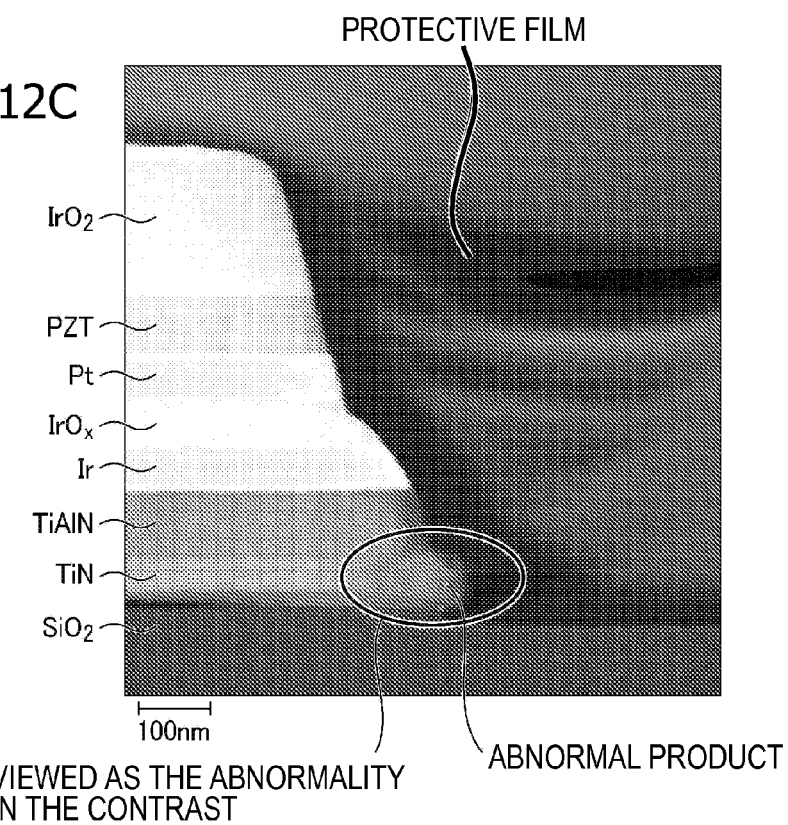

Next, the ferroelectric memory device according to the seventh embodiment of the present invention is described in reference to FIG. 11. The seventh embodiment relates to a planar type ferroelectric memory device, and the basic manufacturing process is substantially the same as in the first embodiment, and therefore, only the final structure is described. FIG. 11 is a schematic cross-sectional diagram showing the ferroelectric memory device according to the seventh embodiment of the present invention, and the process up to the formation of the switching transistors and the W plugs 34 is substantially the same as in the first embodiment.

In the seventh embodiment, a TiN film 39, a TiAlN film 41, an Ir lower electrode 42, a PZT film 43, an $IrO_x$ first upper electrode 44, and an $IrO_y$ second upper electrode 45 are layered in this order on the first interlayer insulation film 32. After that, the $IrO_y$ second upper electrode 45, the $IrO_x$ first upper electrode 44, and the PZT film 43 are etched sequentially. Then, the Ir lower electrode 42 is etched to a pattern with a greater size.

Next, heat treatment is carried out in an oxygen atmosphere so as to improve the quality of the exposed portions of the TiAlN film 41 through oxidation so that oxygen entering portions 49 are formed. After that, the oxygen entering portions 49, the TiAlN film 41, and the TiN film 39 that are exposed from the surface are removed using the Ir lower electrode 42 as a mask. At this time, the oxygen entering portions 49 remain on the sides of the TiAlN film 41.

After that, heat treatment for restoring the PZT film 43 from the damage is carried out, $Al_2O_3$ films 50 and 51 are formed so as to work as a hydrogen permeation preventing film, a second interlayer insulation film 36 is formed, conductive plugs are formed, and a first metal wire layer is formed in substantially the same manner as in the first embodiment. Subsequently, the process for forming an interlayer insulation film, the process for forming conductive plugs, and the process for forming a metal wire layer are repeated for the number of preferable wire layers. Finally, a cover film is formed of a TEOS oxide film and an SiN film, and thus, the basic structure of the ferroelectric memory device according to the seventh embodiment is complete.

In the seventh embodiment of the present invention as well, an oxygen entering portion 49 is provided on the sides of the TiAlN film that is a conductive oxygen barrier film before heat treatment for restoring the PZT film from the damage is carried out, and therefore, abnormal products is not generated due to the oxidation of Al. As a result, the coating properties of the $Al_2O_3$ films 50 and 51 become excellent, and deterioration due to the entrance of hydrogen or moisture can be prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method for a semiconductor device, characterized by comprising: embedding a conductive plug electrically connected to an impurity region in an interlayer insulation film provided on a semiconductor substrate in which the impurity region is formed; forming at least a conductive oxygen barrier film, a lower electrode, a dielectric film including a ferroelectric substance or a high dielectric substance, and an upper electrode on top of the interlayer insulation film in which the conductive plug is embedded; forming a capacitor with the conductive oxygen barrier film by etching the conductive oxygen barrier film, the lower electrode, the dielectric film including the ferroelectric substance or the high dielectric substance, and the upper electrode, forming an oxygen entering portion in at least a portion of a side of the conductive oxygen barrier film by heat treatment in an oxygen atmosphere at temperature of 400° C. to 500° C.; and restoring the dielectric film from a damage by heat treatment at temperature of 500° C. or higher.

2. The manufacturing method for a semiconductor device according to claim 1, the process of forming at least the conductive oxygen barrier film, the lower electrode, the dielectric film including the ferroelectric substance or the high dielectric substance, and the upper electrode on top of the interlayer insulation film in which the conductive plug is embedded includes the formation of a conductive adhesive film between the conductive plug and the conductive oxygen barrier film.

3. The manufacturing method for a semiconductor device according to claim 1, characterized in that the process of forming the oxygen entering portion in at least a portion of the side of the conductive oxygen barrier film includes the etching of the lower electrode, the dielectric film including the ferroelectric substance or the high dielectric substance, and the upper electrode up to a point when the conductive oxygen barrier film is exposed, which is then followed by the heat treatment in an oxygen atmosphere.

4. The manufacturing method for a semiconductor device according to claim 1, characterized in that the process of forming the oxygen entering portion in at least a portion of the side of the conductive oxygen barrier film includes the formation of the oxygen entering portion on the entire surface of the side of the conductive oxygen barrier film by means of collective etching of the conductive oxygen barrier film, the lower electrode, the dielectric film including the ferroelectric substance or the high dielectric substance, and the upper electrode, which is then followed by the heat treatment in an oxygen atmosphere.

5. The manufacturing method for a semiconductor device according to claim 1, characterized in that the temperature to restore the dielectric film from the damage is 550° C. to 700° C.

6. The manufacturing method for a semiconductor device according to claim 1, characterized in that the temperature to restore the dielectric film from the damage is 610° C. to 650° C.

* * * * *